United States Patent
Takeguchi et al.

(10) Patent No.: US 9,362,338 B2
(45) Date of Patent: Jun. 7, 2016

(54) VERTICAL THIN FILM TRANSISTORS IN NON-VOLATILE STORAGE SYSTEMS

(71) Applicant: SanDisk 3D LLC, Milpitas, CA (US)

(72) Inventors: Naoki Takeguchi, Yokkaichi (JP); Hiroaki Iuchi, Nagoya (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/195,636

(22) Filed: Mar. 3, 2014

(65) Prior Publication Data

US 2015/0249112 A1 Sep. 3, 2015

(51) Int. Cl.
| | |
|---|---|
| H01L 27/24 | (2006.01) |
| H01L 21/8234 | (2006.01) |
| H01L 21/02 | (2006.01) |
| H01L 21/3213 | (2006.01) |
| H01L 27/10 | (2006.01) |

(52) U.S. Cl.
CPC ........ *H01L 27/2454* (2013.01); *H01L 21/0228* (2013.01); *H01L 21/02274* (2013.01); *H01L 21/32133* (2013.01); *H01L 21/32139* (2013.01); *H01L 21/823487* (2013.01); *H01L 27/101* (2013.01)

(58) Field of Classification Search
None
See application file for complete search history.

(56) References Cited

U.S. PATENT DOCUMENTS

| | | | |
|---|---|---|---|
| 4,370,661 A | 1/1983 | Berkowitz | |
| 5,313,432 A | 5/1994 | Lin et al. | |
| 5,442,215 A | 8/1995 | Chae | |
| 5,915,167 A | 6/1999 | Leedy | |
| 5,936,896 A | 8/1999 | Cho | |
| 6,049,106 A | 4/2000 | Forbes | |
| 6,141,236 A | 10/2000 | Kengeri | |
| 6,222,762 B1 | 4/2001 | Guterman | |
| 6,310,793 B1 | 10/2001 | Brox | |
| 6,388,927 B1 | 5/2002 | Churchill | |
| 6,399,447 B1 | 6/2002 | Clevenger | |

(Continued)

FOREIGN PATENT DOCUMENTS

| | | |
|---|---|---|
| WO | WO 2010/117912 A1 | 10/2010 |
| WO | WO 2012/082770 A1 | 6/2012 |
| WO | WO 2012/082775 A1 | 6/2012 |

OTHER PUBLICATIONS

U.S. Appl. No. 14/197,985, filed Mar. 5, 2015.

(Continued)

*Primary Examiner* — Kimberly Rizkallah
*Assistant Examiner* — Bo Bin Jang
(74) *Attorney, Agent, or Firm* — Vierra Magen Marcus LLP

(57) ABSTRACT

Three-dimensional (3D) non-volatile memory arrays having a vertically-oriented thin film transistor (TFT) select device and method of fabricating are described. The vertically-oriented TFT may be used as a vertical bit line selection device to couple a global bit line to a vertical bit line. A select device pillar includes a body and upper and lower source/drain regions. At least one gate is separated horizontally from the select device pillar by a gate dielectric. Each gate is formed over the gate dielectric and a base that extends horizontally at least partially between adjacent pillars. The base is formed with notches filled with the gate dielectric. The select device is fabricated using a conformally deposited base dielectric material and conformal hard mask layer that is formed with a larger bottom thickness than horizontal thickness. The base thickness is defined by the deposition thickness, rather than an uncontrolled etch back.

16 Claims, 15 Drawing Sheets

(56) References Cited

U.S. PATENT DOCUMENTS

| | | |
|---|---|---|
| 6,459,123 B1 | 10/2002 | Enders |
| 6,480,417 B2 | 11/2002 | Elmhurst |
| 6,492,212 B1 | 12/2002 | Ieong |
| 6,538,922 B1 | 3/2003 | Khalid et al. |
| 6,542,431 B2 | 4/2003 | Nakagawa |
| 6,569,715 B1 | 5/2003 | Forbes |
| 6,610,576 B2 | 8/2003 | Nowak |
| 6,617,180 B1 | 9/2003 | Wang |
| 6,678,192 B2 | 1/2004 | Gongwer |
| 6,750,487 B2 | 6/2004 | Fried |
| 6,841,834 B2 | 1/2005 | Nowak |
| 6,879,505 B2 | 4/2005 | Scheuerlein |
| 6,930,324 B2 | 8/2005 | Kowalski |
| 7,019,342 B2 | 3/2006 | Hackler, Sr. |
| 7,101,741 B2 | 9/2006 | Fried |
| 7,130,239 B2 | 10/2006 | Lakhani |
| 7,132,685 B2 | 11/2006 | Chen |
| 7,184,302 B2 | 2/2007 | Yang |
| 7,233,024 B2 | 6/2007 | Scheuerlein |
| 7,237,074 B2 | 6/2007 | Guterman |
| 7,249,225 B1 | 7/2007 | Seidl |
| 7,256,458 B2 | 8/2007 | Nowak |
| 7,324,393 B2 | 1/2008 | Chan et al. |
| 7,468,906 B2 | 12/2008 | Kuo |
| 7,486,587 B2 | 2/2009 | Scheuerlein |
| 7,489,002 B2 | 2/2009 | Forbes et al. |
| 7,558,141 B2 | 7/2009 | Katsumata et al. |
| 7,588,971 B2 | 9/2009 | Wang et al. |
| 7,613,868 B2 | 11/2009 | Yang |
| 7,634,744 B2 | 12/2009 | Sumimoto |
| 7,645,650 B2 | 1/2010 | Bryant |
| 7,768,013 B2 | 8/2010 | Kim et al. |
| 7,830,713 B2 | 11/2010 | Lee |
| 7,869,258 B2 | 1/2011 | Scheuerlein |
| 7,952,163 B2 | 5/2011 | Baek |
| 7,983,065 B2 | 7/2011 | Samachisa |
| 8,003,457 B2 | 8/2011 | Chen |
| 8,027,209 B2 | 9/2011 | Yan |
| 8,199,576 B2 | 6/2012 | Fasoli et al. |
| 8,411,477 B2 | 4/2013 | Tang et al. |
| 8,618,614 B2 | 12/2013 | Scheuerlein |
| 2003/0003611 A1 | 1/2003 | Weiner |
| 2003/0206481 A1 | 11/2003 | Hsu |
| 2004/0151024 A1 | 8/2004 | Fricke |
| 2004/0159868 A1 | 8/2004 | Rimerson |
| 2004/0178446 A1 | 9/2004 | Sundaresan |
| 2005/0022264 A1 | 1/2005 | Fanger |
| 2005/0170606 A1* | 8/2005 | Fu et al. .................. 438/424 |
| 2006/0145144 A1 | 7/2006 | Lee et al. |
| 2006/0197153 A1 | 9/2006 | Huang et al. |
| 2006/0250837 A1 | 11/2006 | Herner |
| 2006/0273370 A1 | 12/2006 | Forbes |
| 2007/0083679 A1 | 4/2007 | Kikuchi |
| 2007/0133268 A1 | 6/2007 | Choi |
| 2007/0259467 A1* | 11/2007 | Tweet et al. .................. 438/48 |
| 2008/0002461 A1 | 1/2008 | Rimerson |
| 2008/0085603 A1* | 4/2008 | Disney .................. 438/704 |
| 2008/0089127 A1 | 4/2008 | Mokhlesi |
| 2008/0175032 A1 | 7/2008 | Tanaka |
| 2009/0001344 A1 | 1/2009 | Schricker |
| 2009/0141547 A1 | 6/2009 | Jin |
| 2009/0168503 A1 | 7/2009 | Fackenthal |
| 2009/0168523 A1 | 7/2009 | Shirakawa |
| 2009/0218600 A1* | 9/2009 | Park et al. .................. 257/202 |
| 2009/0273054 A1 | 11/2009 | Kim |
| 2010/0027316 A1 | 2/2010 | Yoon |
| 2010/0046267 A1 | 2/2010 | Yan |
| 2010/0085098 A1 | 4/2010 | Ferguson |
| 2010/0155858 A1 | 6/2010 | Chen |
| 2010/0259961 A1 | 10/2010 | Fasoli |
| 2010/0259962 A1 | 10/2010 | Yan |
| 2011/0147806 A1 | 6/2011 | Wilson |
| 2011/0297912 A1 | 12/2011 | Samachisa et al. |
| 2012/0147644 A1 | 6/2012 | Scheuerlein |
| 2012/0147648 A1 | 6/2012 | Scheuerlein |
| 2012/0147649 A1 | 6/2012 | Samachisa |
| 2012/0147650 A1 | 6/2012 | Samachisa |
| 2012/0182807 A1 | 7/2012 | Lue |
| 2012/0228712 A1 | 9/2012 | Jeong et al. |
| 2013/0126821 A1 | 5/2013 | Sekar et al. |
| 2013/0308363 A1 | 11/2013 | Scheuerlein et al. |
| 2013/0322174 A1 | 12/2013 | Li et al. |

OTHER PUBLICATIONS

Hung et al., "A Highly Scalable Vertical Gate (VG) 3D NAND Flash with Robust Program Disturb Immunity Using a Novel PN Diode Decoding Structure," 2011 Symposium on VLSI Technology Digest of Technical Papers, Jun. 2011, pp. 68-69, 2 pages.

Kalkofen et al., "A simple two-step phosphorus doping process for shallow junctions by applying a controlled adsorption and diffusion in an oxidising ambient," Materials Science and Engineering, Symposium B, Dec. 2004, pp. 362-366, vols. 114-115, Elsevier B.V., 5 pages.

Mazzocchi et al., "Boron and Phosphorus dopant activation in germanium using Laser annealing with and without preamorphization implant," 17th IEEE International Conference on Advanced Thermal Processing of Semiconductors, RTP 2009, Sep. 29-Oct. 2, 2009, 5 pages.

Paviet-Salomon et al., "Experimental and analytical study of saturation current density of laser-doped phosphorus emitters for silicon solar cells," Solar Energy Materials & Solar Cells, Aug. 2011, pp. 2536-2539, vol. 95, Issue 8, Elsevier B.V., 4 pages.

U.S. Appl. No. 13/788,990, filed Mar. 7, 2013.
U.S. Appl. No. 13/670,233, filed Nov. 6, 2012.
U.S. Appl. No. 13/839,366, filed Mar. 15, 2013.

* cited by examiner

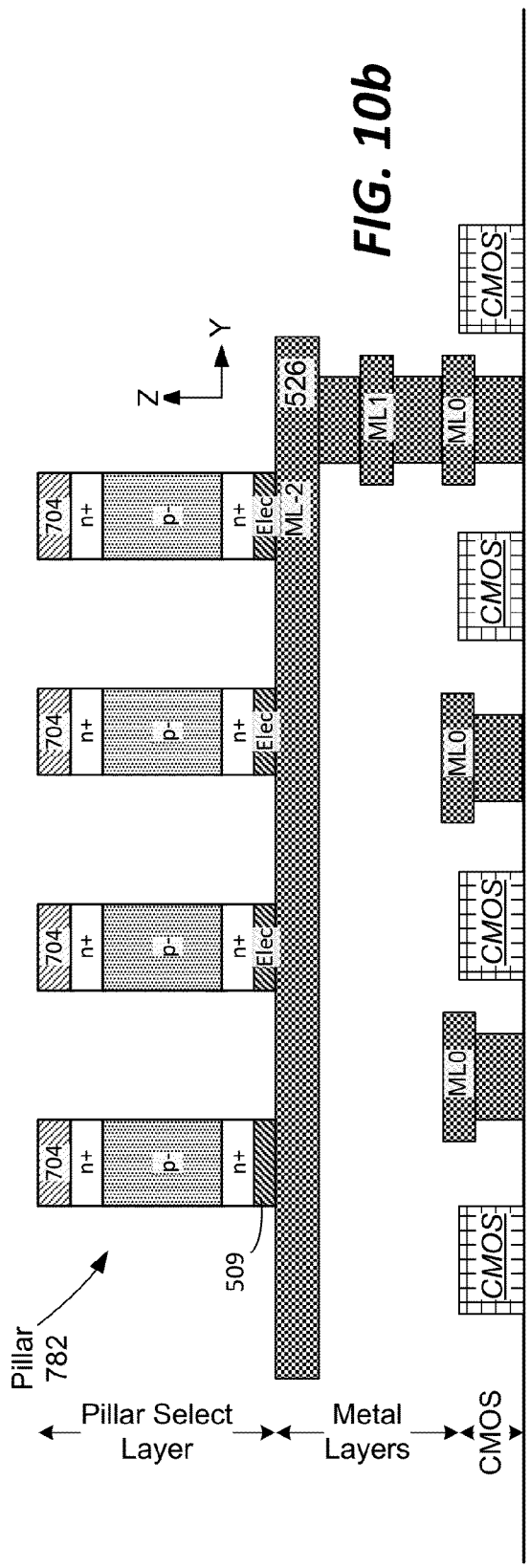
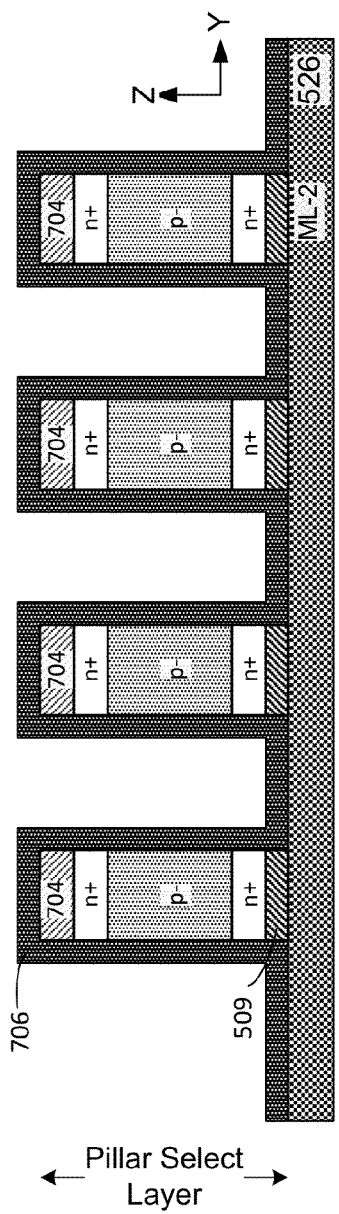

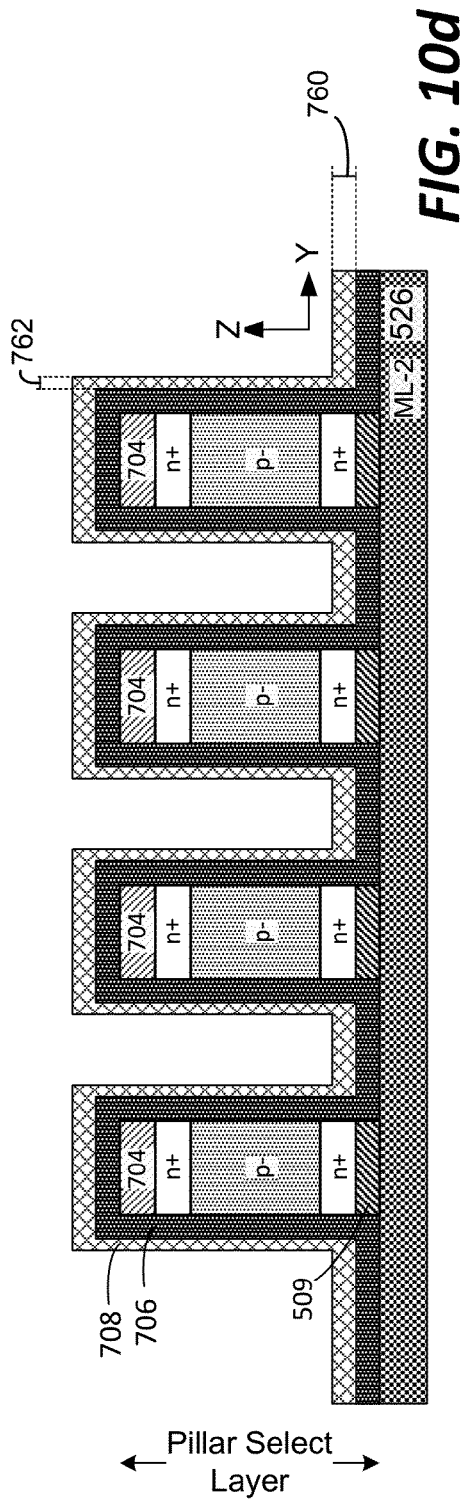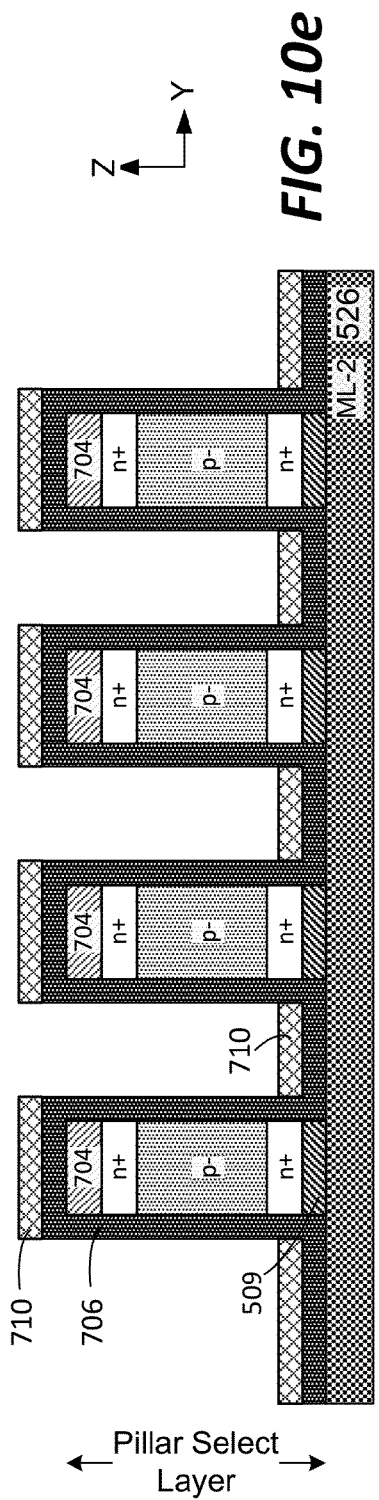

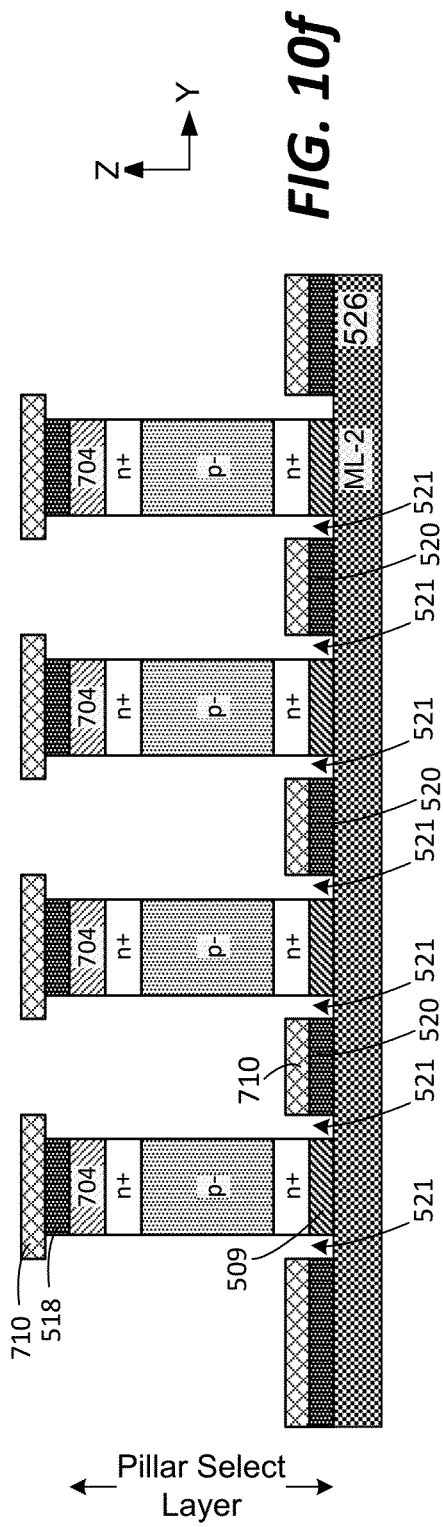
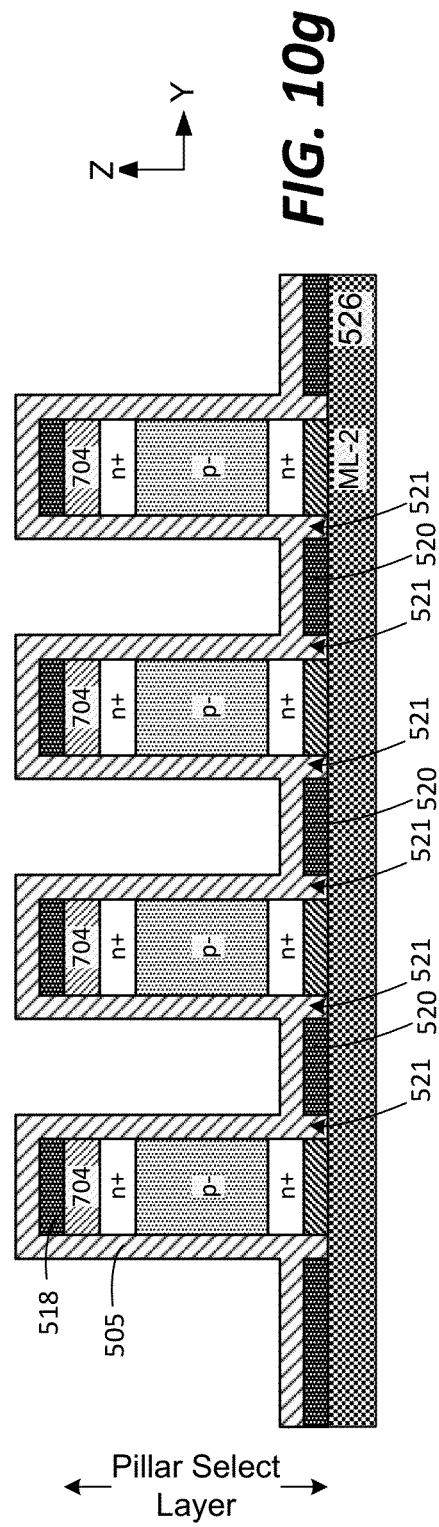

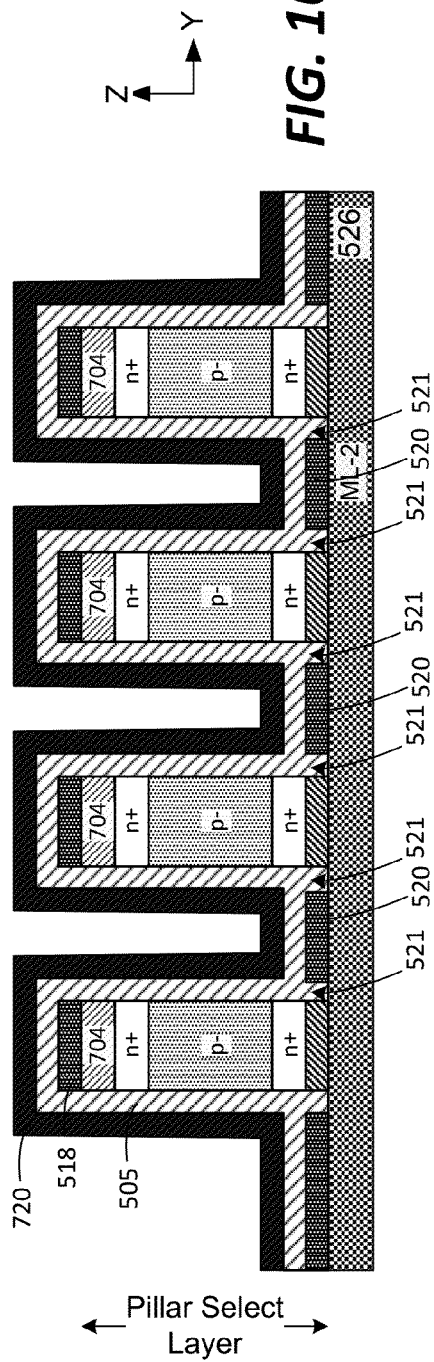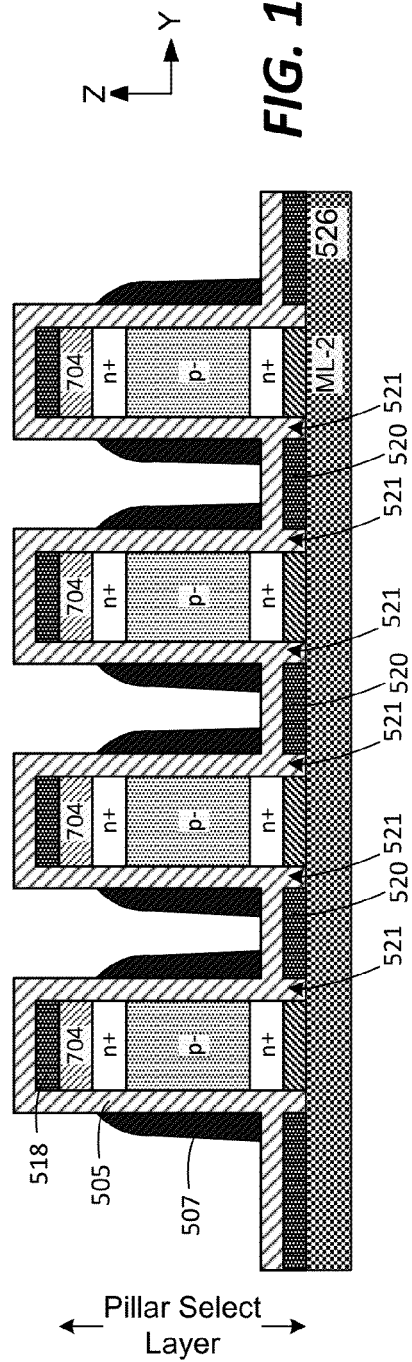

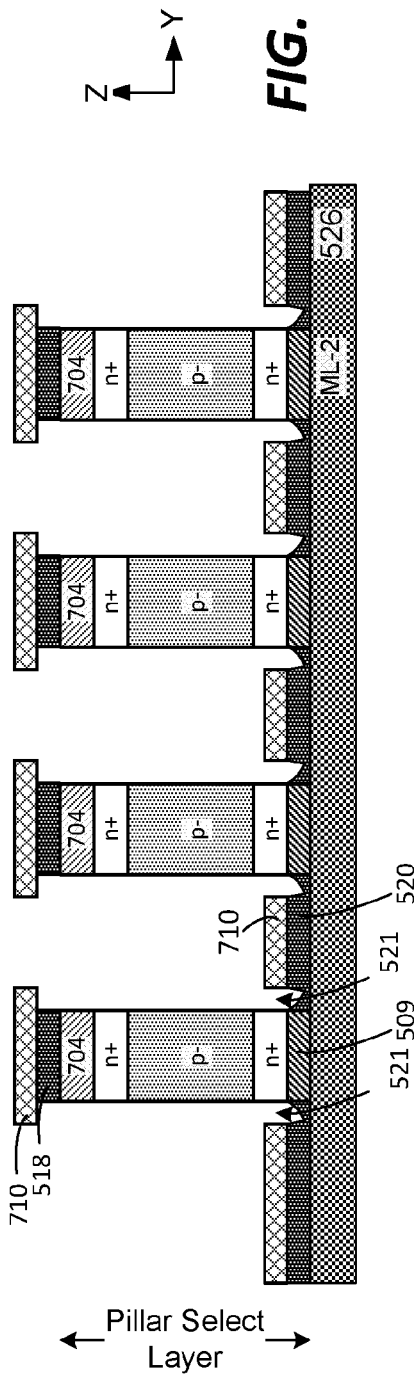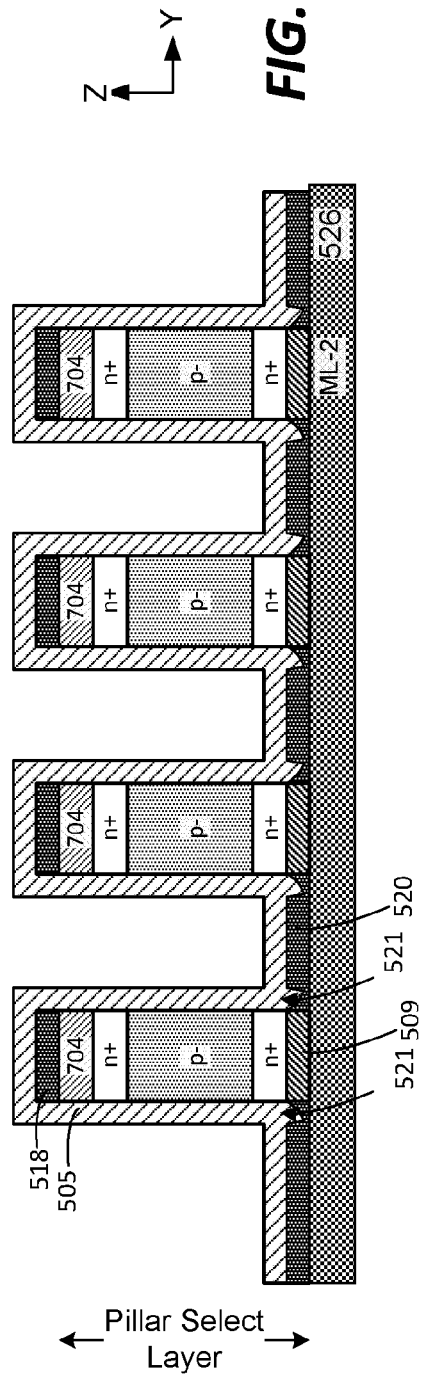

VERTICAL THIN FILM TRANSISTORS IN NON-VOLATILE STORAGE SYSTEMS

BACKGROUND OF THE INVENTION

The present disclosure relates to technology for non-volatile storage.

One example of non-volatile memory uses variable resistance memory elements that may be set to either low or high resistance states. Upon application of sufficient voltage, current, or other stimulus, the variable resistance memory element switches to a stable low-resistance state, which is sometimes referred to as SETTING the device. This resistivity-switching is reversible such that subsequent application of an appropriate voltage, current, or other stimulus can serve to return the reversible resistivity-switching material to a stable high-resistance state, which is sometimes referred to as RESETTING the device. This conversion can be repeated many times.

The variable resistance memory elements may be in a high resistance state when first manufactured. This may be referred to as the "virgin state." In the virgin state, the resistance could be even higher than for the RESET state. The term "FORMING" is sometimes used to describe putting the variable resistance memory elements into a lower resistance state for the first time. For some memory elements, the FORMING operation requires a higher voltage than the SET and/or RESET operations.

3D memory arrays having variable resistance memory elements have been proposed. In one possible architecture, word lines extend horizontally and bit lines extend vertically. There a multiple levels of the word lines, hence multiple levels of memory elements. Each memory element is located between one of the vertical bit lines and one of the horizontal word lines. During operation, some of the memory cells are selected for the SET, RESET, or FORM operation, while others are unselected.

BRIEF DESCRIPTION OF THE DRAWINGS

FIGS. 10a-10j are perspective and cross-sectional views of a pillar select layer according to a fabrication process in one embodiment.

FIGS. 11a-11b are cross-sectional views of a pillar select layer according to a fabrication process in one embodiment.

DETAILED DESCRIPTION

Figure 1:
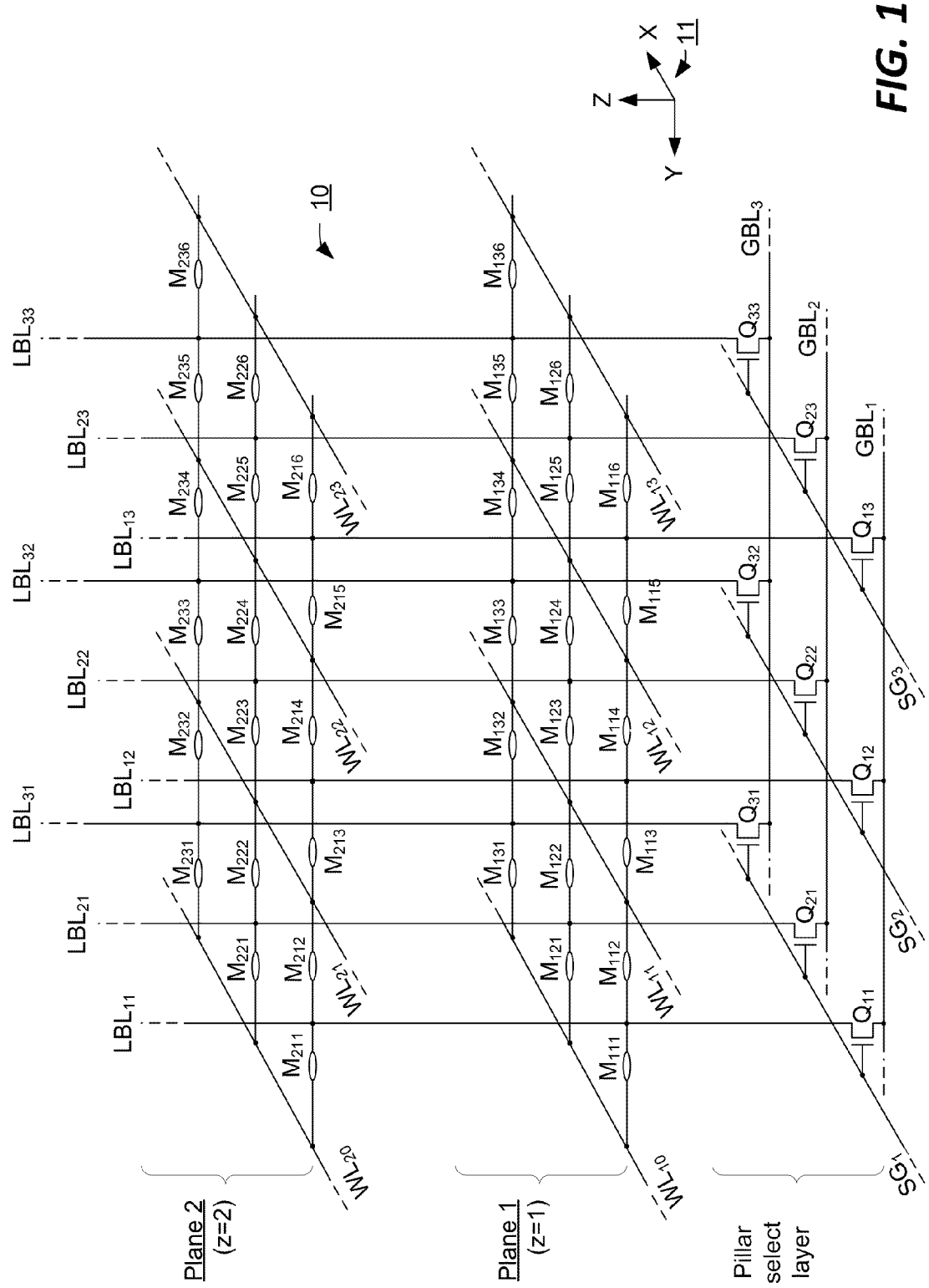
FIG. 1 is an equivalent circuit for a portion of an example three-dimensional array of variable resistance memory elements.

The disclosed technology is directed to a three-dimensional (3D) non-volatile memory array having a vertically-oriented thin film transistor (TFT) select device and method of fabricating a 3D memory with a vertically-oriented TFT select device. The vertically-oriented TFT, or more simply vertical TFT, may be used as a vertical bit line select device in one embodiment, coupling a global bit line to a local vertical bit line. A select device pillar includes a body and upper and lower source/drain regions. At least one gate is separated horizontally from the select device pillar by a gate dielectric. Each gate is formed over and separated from the underlying global bit line by a base and a portion of the gate dielectric. The base is formed with notches extending through at least a portion of the base at the horizontal end portions of the base. The notches are filled with the gate dielectric material. A conformal deposition process for the base dielectric material and a hard mask formation process provide tight control for the base thickness. In this manner, the gate bottom height can be formed with tight control for consistent select device performance.

The vertical TFT select device is fabricated in one embodiment by first forming pillar stack lines that include a plurality of select device pillars. Each pillar includes a body, an upper source/drain region, and a lower source/drain region. Additional regions such as contact and insulating regions may be formed over the upper source/drain region. Additional regions such as an electrode may be formed under the lower source/drain region. A dielectric base layer is formed that extends vertically along the vertical sidewalls of the pillar stack lines and horizontally over the global bit line between adjacent pillar stack lines. The dielectric base layer is formed using a conformal process such as atomic layer deposition. A hard mask is then formed, also using a conformal process in one embodiment. The hard mask extends vertically along the vertical sidewalls of the dielectric base layer and horizontally over the dielectric base layer between adjacent pillar stack lines. The hard mask can be formed using plasma vapor deposition in one example. The hard mask is formed with a sidewall thickness that is less than a vertical thickness. That is, the sidewall portions of the hard mask and formed with a smaller dimension than the horizontal portions.

The hard mask is formed with a high etch selectivity to the dielectric base material. The hard mask is then etched back using a process highly selective for the hard mask material. The etch back removes the sidewall portions of the hard mask while the horizontal portions remain due to their differing thicknesses. The dielectric base layer material is then etched back. The horizontal portions of the hard mask protect the dielectric base material so that bases are formed between the adjacent pillar stack lines. The use of the hard mask causes notches to be etched into each base at its horizontal endpoints. A gate dielectric layer is then formed. The gate dielectric extends along vertical sidewalls of the pillar stack lines and over the bases between pillar stack lines. The gate dielectric also fills the notches formed in the bases. The gate material is formed and etched back to form at least one gate for each pillar. In one example, each gate extends vertically along the vertical sidewalls of a corresponding pillar stack line. A gap fill dielectric is then formed.

The hard mask formation permits the dielectric base layer to be formed conformally with a desired thickness based on the deposition process. The dielectric base layer has a vertical dimension that is not defined by an etch back of the horizontal upper surface of the base dielectric material. Instead, the initial deposition defines the base thickness by virtue of protecting the base region by the hard mask during etch back. In this manner, the base formation process is controlled to reduce variations in thickness, and thereby provide tight control of gate-drain overlap and gate bottom height.

In one embodiment, the vertical TFT is used as a bit line selection device in a three-dimensional (3D) array of memory elements where bit lines of the array are oriented vertically. That is, instead of stacking a plurality of two-dimensional arrays on a common semiconductor substrate, where each two-dimensional array has its own bit lines, multiple two-dimensional arrays are stacked on top of each other in separate planes but then share common bit lines that extend up through the planes. As a selection device, the vertical TFT may be referred to as a select gate or decoder. Memory elements in a 3D memory array may be controlled by applying proper voltages to their vertical bit lines and word lines. By applying either a select voltage or an unselect voltage to the vertical bit lines, while applying either a select voltage or an unselect voltage to the horizontal word lines, memory cells are selected/unselected for operations such as SET, RESET, and FORM. The vertical TFT selection device provides the proper voltage to the vertical bit line.

In FIG. 1, an architecture of a three-dimensional memory 10 is described using a schematic of an equivalent circuit of a portion of the 3D memory. A standard three-dimensional rectangular coordinate system 11 is used for reference, the directions of each of vectors x, y and z being orthogonal with the other two. In another embodiment direction x and y are substantially 60 degrees from each other. The array in FIG. 1 includes vertical bit lines.

A circuit for selectively connecting internal memory elements with external data circuits is formed using select devices $Q_{xy}$, where x gives a relative position of the device in the x-direction and y its relative position in the y-direction. The individual select devices $Q_{xy}$ are vertical TFTs in accordance with embodiments. Global bit lines ($GBL_x$) are elongated in the y-direction and have relative positions in the x-direction that are indicated by the subscript. The global bit lines ($GBL_x$) are individually connectable with the source or drain of the vertical TFT select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of vertical TFT select devices $Q_{xy}$ having a common position in the y-direction. The vertical TFT select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the vertical TFT select devices to which it is connected. The remaining row select lines receive voltages that keep their connected vertical TFT select devices $Q_{xy}$ off. It may be noted that since only one vertical TFT select device ($Q_{xy}$) is used with each of the local bit lines ($LBL_{xy}$), the pitch of the array across the semiconductor substrate in both x and y-directions may be made very small, and thus the density of the memory storage elements large.

Memory elements $M_{zxy}$ are formed in a plurality of planes positioned at different distances in the z-direction above a substrate (which may be below the pillar select layer). Two planes 1 and 2 are illustrated in FIG. 1 but there will typically be additional planes such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{zy}$ and word line $WL_{zy}$ between which the memory element is connected. The voltages are chosen to provide the electrical stimulus necessary to cause the state of the memory element to change from an existing state to the desired new state. After the device is first fabricated, voltages may be selected to provide the electrical stimulus necessary to "form" the memory element, which refers to lowering its resistance from a virgin state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

The memory arrays described herein, including memory 10, may be monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

The material used for the non-volatile memory elements $M_{zxy}$ in the arrays described herein can be a chalcogenide, a metal oxide, CMO, or any one of a number of materials that exhibit a stable, reversible shift in resistance in response to an external voltage applied to or current passed through the material. Other materials can also be used. The technologies described below are not restricted to any one set of materials for forming the non-volatile memory elements.

By way of example, metal oxides are characterized by being insulating when initially deposited. One suitable metal oxide is a titanium oxide ($TiO_x$). A composite structure can be formed in a non-conductive (high resistance) state. When a large negative voltage (such as 1.5 volt) is applied across the structure, a relatively high current can flow through the structure. The device is then in its low resistance (conductive) state. The conductive path is broken by applying a large positive voltage across the structure. The device returns to its high resistance state. Both of the conductive and non-conductive states are non-volatile. Examples of other oxide materials that can be used for the non-volatile memory elements $M_{zxy}$ in the array include HfOx, ZrOx, WOx, NiOx, CoOx, CoAlOx, MnOx, $ZnMn_2O_4$, ZnOx, TaOx, NbOx, HfSiOx, HfAlOx.

Another class of materials suitable for the memory storage elements includes solid electrolytes. They are electrically conductive when deposited. Individual memory elements can be formed and isolated from one another. Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W.

Carbon may also be used as a non-volatile memory element. Carbon is usually used in two forms, conductive (or grapheme like-carbon) and insulating (or amorphous carbon). The operation of a carbon resistive switching nonvolatile memories involves transforming chemical bond configurations by applying appropriate current (or voltage) pulses to the carbon structure. For example, when a very short high amplitude voltage pulse is applied across the material, the conductance is greatly reduced as the carbon may be in an amorphous state. On the other hand, when in the reset state, applying a lower voltage for a longer time causes part of the material to change into the conductive state. Carbon nanotubes (CNTs) may be used as a non-volatile memory material. Such nanotubes can demonstrate very high conductivity. When an electric field is applied across this fabric, the CNT's tend to flex or align themselves such that the conductivity of their fabric is changed.

Yet another class of materials suitable for the memory storage elements is phase-change materials. A group of phase-change materials may includes chalcogenide glasses, often of a composition $Ge_xSb_yTe_z$, where x=2, y=2 and z=5. GeSb may also be used. Other materials include AgInSbTe, GeTe, GaSb, BaSbTe, InSbTe and various other combinations of these basic elements. When a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines can be made of the conductive materials described above. In embodiments using additional conductive segments for at least one of the two memory element electrodes, those segments can be made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where steering elements are included. The diode can be a p-n junction (not necessarily of silicon), a metal/insulator/insulator/metal (MIIM), or a Schottky type metal/semiconductor contact but can alternately be a solid electrolyte element.

For simplicity the above description has considered the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC).

Additional information regarding the various memory materials that may be used can be found in U.S. patent application Ser. No. 13/788,990, entitled Vertical Bit line TFT Decoder for High Voltage Operation," filed Mar. 7, 2013 and incorporated by reference herein in its entirety.

Figure 2:
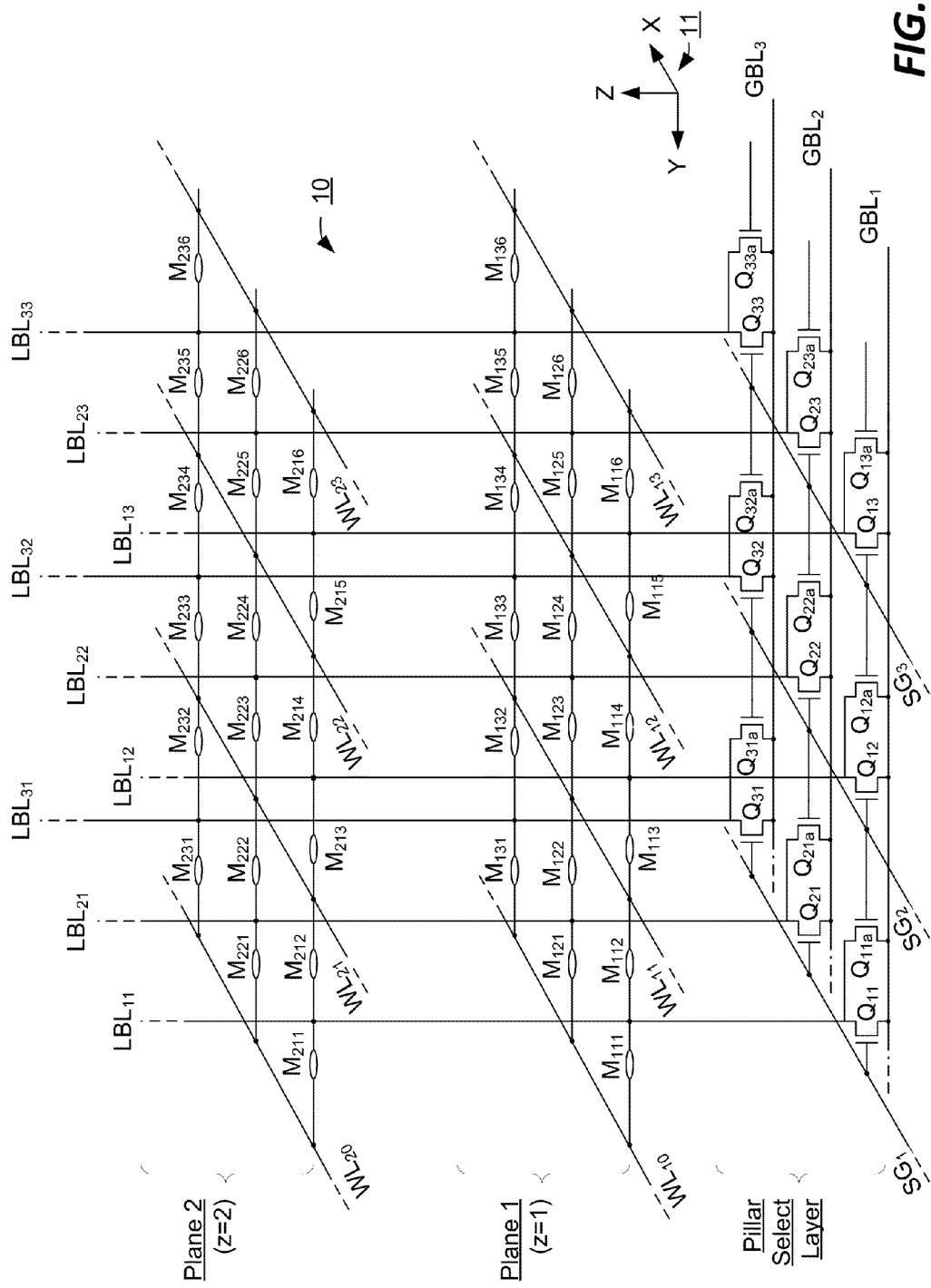
FIG. 2 is an equivalent circuit for a portion of another example three-dimensional array of variable resistance memory elements.

FIG. 2 is a partial schematic of a three-dimensional memory 10 that includes a double-gated structure for the vertically oriented TFT select devices Qxy. Planes 1 and 2 of FIG. 2 are the same as in FIG. 1. As can be seen, each local bit line LBL is connectable to a respective global bit line GBL by two row select signals. FIG. 2 shows two transistors connecting to each local bit line. For example, transistor $Q_{11}$ can connect local bit line $LBL_{11}$ to global bit line $GBL_1$ in response to row select line $SG_1$ and transistor $Q_{11a}$ can connect local bit line $LBL_{11}$ to global bit line $GBL_1$ in response to row select line $SG_2$. The same structure is used for the other local bit lines depicted in FIG. 2.

Figure 3:
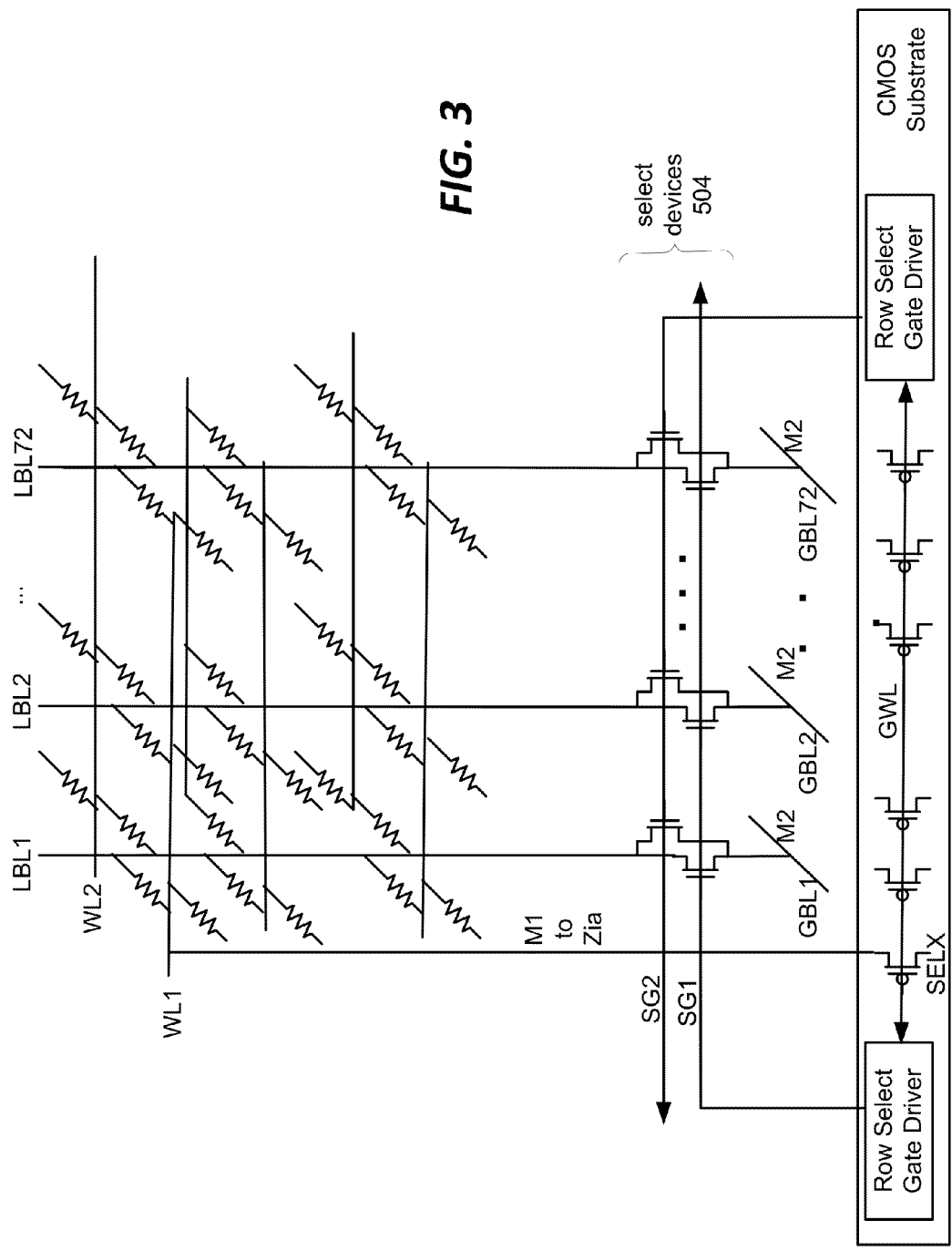
FIG. 3 is a schematic of a portion of a memory system, depicting vertical bit lines, vertically oriented select devices above the substrate and row select line drivers in the substrate.

FIG. 3 shows another partial schematic also depicting the double-gated structure such that each local bit line (LBL1, LBL2, ... LBL72) are connected to their respective global bit lines (GBL1, GBL2, ... GBL72) by any of two respective vertically oriented TFT select devices that are positioned above a CMOS substrate. As can be seen, while the double-gated structure includes positioning the various select devices 504 above the substrate, the Row Select Line Drivers providing the row select lines $SG_1$, $SG_2$, ... are positioned in the substrate. Similarly, the global word lines (e.g., GWL) are position in a metal layer on the substrate and below the vertically oriented select devices. Furthermore, the Row Select Line Driver uses the appropriate global word line GWL as an input in one embodiment.

Figure 4:
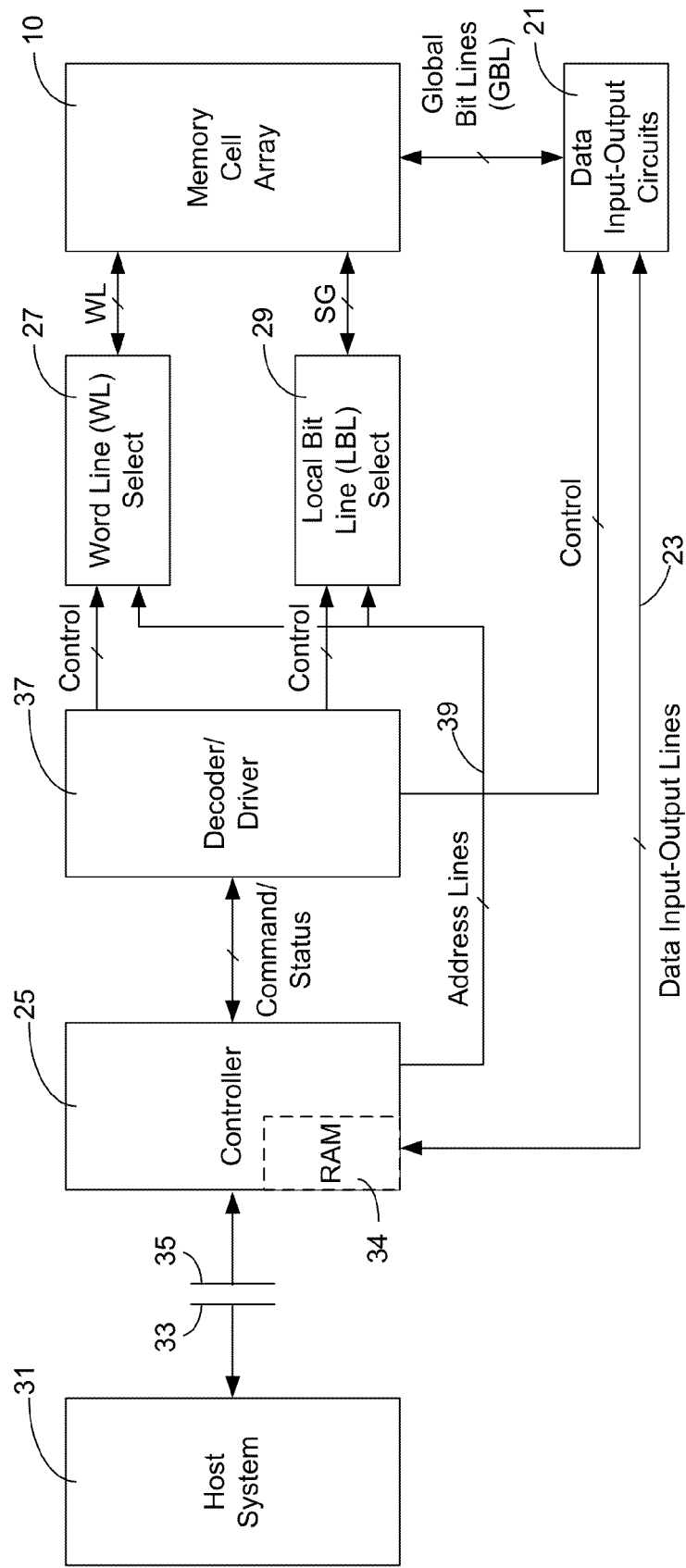
FIG. 4 is a schematic block diagram of a re-programmable non-volatile memory system which can utilize the memory arrays of FIGS. 1-3, and which indicates connection of the memory system with a host system.

FIG. 4 is a block diagram of an illustrative memory system that can use the three-dimensional memory 10 of FIGS. 1-3. Data input-output circuits 21 are connected to provide (during programming) and receive (during reading) analog electrical quantities in parallel over the global bit-lines $GBL_x$ that are representative of data stored in addressed memory elements $M_{zxy}$. Data input-output circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 27 and local bit line circuits 29. In the specific three-dimensional array of FIGS. 1-3, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the local bit line select circuits 29 partially address the designated storage elements within the array 10 by placing proper voltages on the control elements of the select devices $Q_{xy}$ to connect selected local bit lines ($LBL_y$) with the global bit lines ($GBL_x$). The addressing is completed by the circuits 27 applying proper voltages to the word lines $WL_{zy}$ of the array.

Although each of the memory elements $M_{zxy}$ in the array of FIGS. 1-3 may be individually addressed for changing its state according to incoming data or for reading its existing storage state, it may be preferable to program and read the array in units of multiple memory elements in parallel. One row of memory elements on one plane may be programmed and read in parallel, for example. The number of memory elements operated in parallel depends on the number of memory elements connected to the selected word line. In some arrays, the word lines may be segmented (not shown in FIGS. 1-3) so that only a portion of the total number of memory elements connected along their length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is may be preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to flash memory arrays. Resetting a block of memory elements to a common state corresponds to erasing a block of flash memory elements to an erased state. The individual blocks of memory elements may be further divided into a plurality of pages of storage elements. The memory elements of a page can be programmed and read together. This is similar to the use of pages in flash memories. The memory elements of an individual page are programmed and read together. When programming, those memory elements that are to store data that are represented by the reset state are not changed from the reset state. Those of the memory elements of a page that need to be changed to another state in order to represent the data being stored in them have their states changed by the programming operation. Example resetting, programming (e.g., setting) and reading operations of a memory array like that of FIGS. 1-3 can be found in U.S. patent application Ser. No. 13/788,990, entitled Vertical Bit line TFT Decoder for High Voltage Operation," filed Mar. 7, 2013 and incorporated by reference herein in its entirety.

Figure 5:
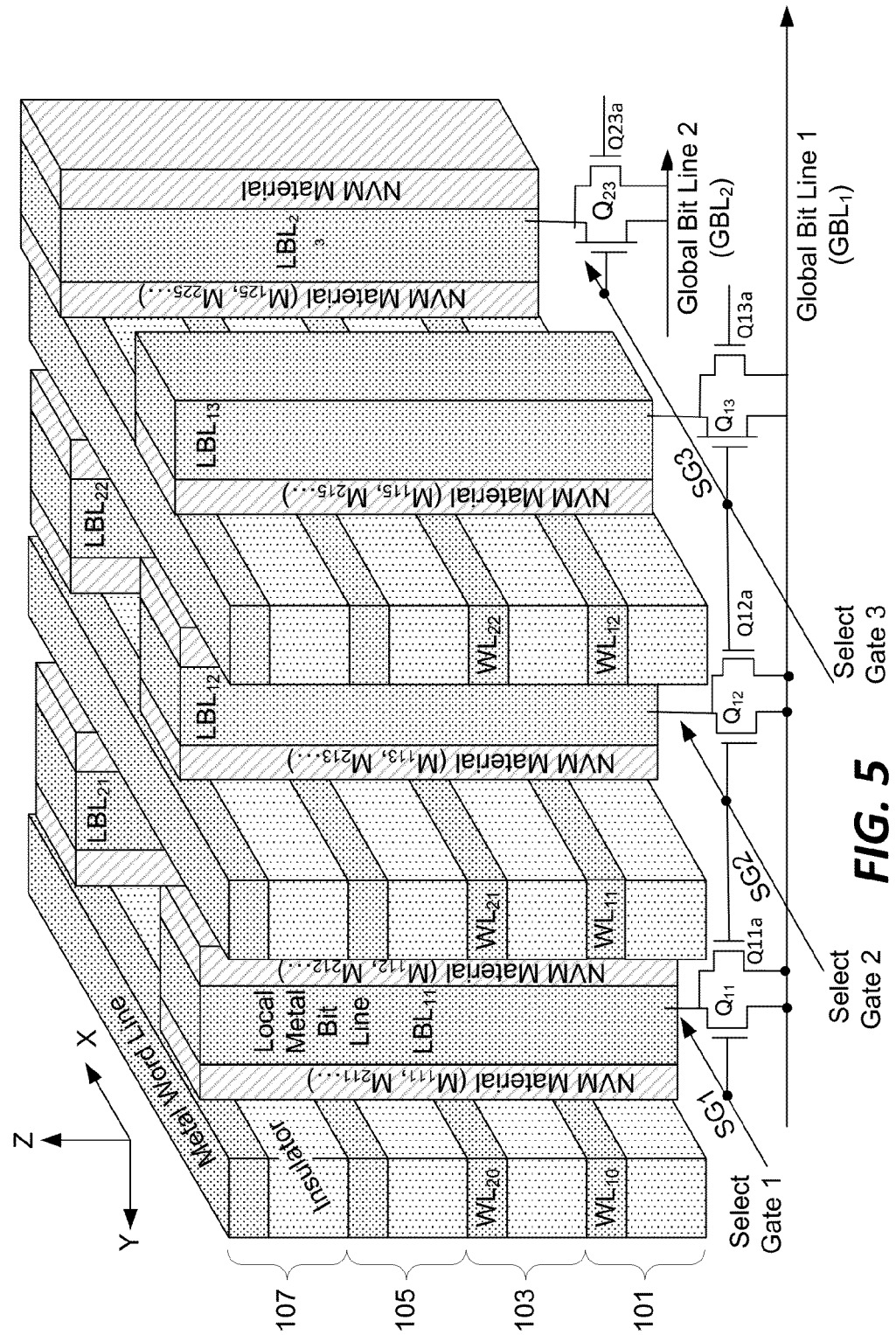
FIG. 5 is an isometric view of a portion of the three-dimensional array shown in FIG. 2 according to one example of an implementation.

One example semiconductor structure for implementing a three-dimensional memory element array of FIG. 2 is illustrated in FIG. 5 which is configured for use of non-volatile memory (NVM) material that is non-conductive when first deposited. A metal oxide can be used for this characteristic in one example. Since the material is initially non-conductive, the memory elements at the cross-points of the word and bit lines are not isolated from each other. Several memory elements may be implemented by a single continuous layer of material, which in the case of FIG. 5 are strips of NVM material oriented vertically along opposite sides of the vertical bit lines in the y-direction and extending upwards through all the planes. A significant advantage of the structure of FIG. 5 is that all word lines and strips of insulation under them in a group of planes may be defined simultaneously by use of a single mask, thus greatly simplifying the manufacturing process.

A small part of four planes 101, 103, 105 and 107 of the three-dimensional array are shown. Elements of the FIG. 5 array that correspond to those of the equivalent circuit of FIG. 1 are identified by the same reference numbers. It will be noted that FIG. 5 shows the two planes 1 and 2 of FIG. 3 plus two additional planes on top of them. All of the planes have the same horizontal pattern of conductor, dielectric and NVM material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) running in the y-direction at the same pitch as the pillar spacing through the vertical TFT select devices ($Q_{xy}$) whose gates are driven by the row select lines (SG) elongated in the x-direction. The vertical TFT select devices have a channel extension, in one embodiment.

Not shown in FIG. 5 are sense amplifiers, input-output (I/O) circuitry, control circuitry, and other peripheral circuitry. There is one row select line (SG) for each row of local bit line pillars in the x-direction and two vertical TFT select device (Q) for each individual vertical local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines. In one embodiment, the NVM material includes Hafnium Oxide, the word lines comprise TiN, and the bit lines comprise N+ silicon.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element does not conduct a significant amount of current. Similarly, in other embodiments, the non-conducting NVM material may be left in place between adjacent local bit lines if the operating voltages between the adjacent LBLs remain below the programming threshold.

To enable the memory to be denser (e.g., more memory elements per area), the size of the memory elements can be made small and the memory elements can be arranged close to each. To enable the memory elements to be close to each other, one embodiment uses a vertically oriented TFT decoder for connecting the individual local vertical bit line pillars to the respective global bit lines. In one embodiment, each vertically oriented TFT select device is a pillar select device that is formed as a vertical structure, switching between a local bit line pillar and a global bit line. The vertical TFT select devices, are in the present embodiments formed in a separate layer (pillar select layer) above the CMOS layer/substrate, along the z-direction between the array of global bit lines and the array of local bit lines. The CMOS layer is the substrate where the support circuitry is implemented, including the row select circuit and word line drivers. The use of vertically oriented TFT select devices above, but not in, the substrate allows the memory elements to be arranged in a more compact fashion, thereby increasing density. Additionally, positioning the vertically oriented TFT select devices above the substrate allows for other devices (e.g., the word line drivers) to be positioned in the substrate under the memory array rather than outside of the array, which allows the integrated circuit to be smaller.

For example, a pillar shaped vertical Thin Film Transistor (TFT) can be can be used as the select device. In one example implementation, a control node of the select transistor has a collar shaped hole, and the gate and channel region are formed in the hole with the source/drain regions formed above/below the channel region. Another alternative is to define the gates as a rail etch and have the channel deposited in a trench between the gates and singulated by an etch with crossing lines mask (rather than holes).

Figure 6:
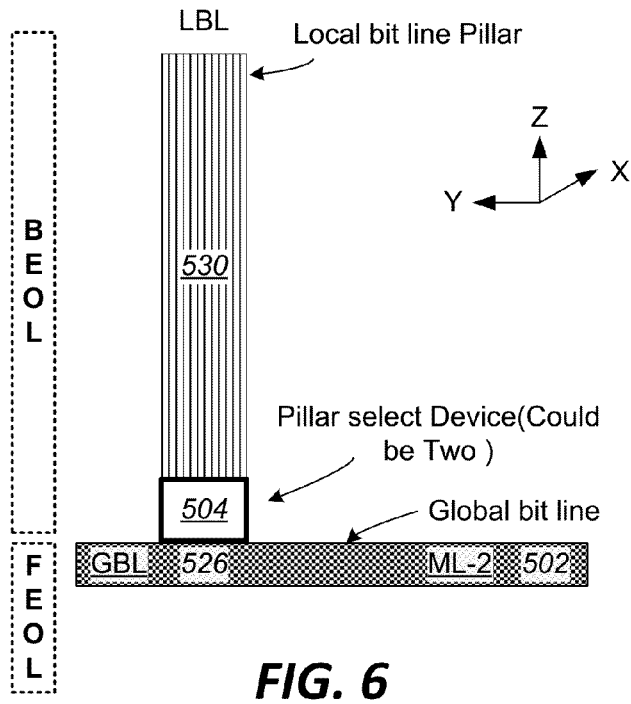
FIG. 6 is a plan view that depicts a vertical bit line, a vertically oriented select device and a global bit line.

FIG. 6 illustrates the structure of a vertically oriented TFT select device in relation to the local bit line and the global bit line. The 3D memory 10 is formed on top of a CMOS substrate (not shown explicitly) where structures in the CMOS are referred to as being in the FEOL ("Front End of Lines"). The vertically oriented TFT select devices switch individual vertical bit lines (that are above and not in the substrate) to individual global bit lines that are formed on top of the FEOL layer in the BEOL ("Back End of Lines"). Thus, the BEOL includes the pillar select layer with the memory layer on top of it. The vertically oriented TFT select devices (such as $Q_{11}$, $Q_{12}, \ldots, Q_{21}, Q_{22}, \ldots$, etc.) are formed in the pillar select layer as vertically oriented TFT select devices. The pillar select layer is formed above (and not in) the substrate. The vertically oriented TFT select device may switch a local bit line to a global bit line. In the example, the local bit line LBL 530 is switchable to the global bit line GBL 526 by a vertically oriented TFT select transistor 504 such as $Q_{11}$. The gate of the TFT select transistor $Q_{11}$ is controllable by a signal exerted on a row select line $SG_1$ (not shown).

The global bit line such as GBL 526 is formed below the vertically oriented TFT select device, in the FEOL as part of the metal layer-1 or metal layer-2 502. The vertically oriented TFT select device is formed in the BEOL layer on top of the GBL 526 (and above, but not in, the substrate). The local bit line LBL 530, in the form of a pillar, is formed on top of the vertically oriented select device 504. In this way, the vertically oriented TFT select device 504 can switch the local bit line pillar LBL to the global bit line GBL.

Figure 7:
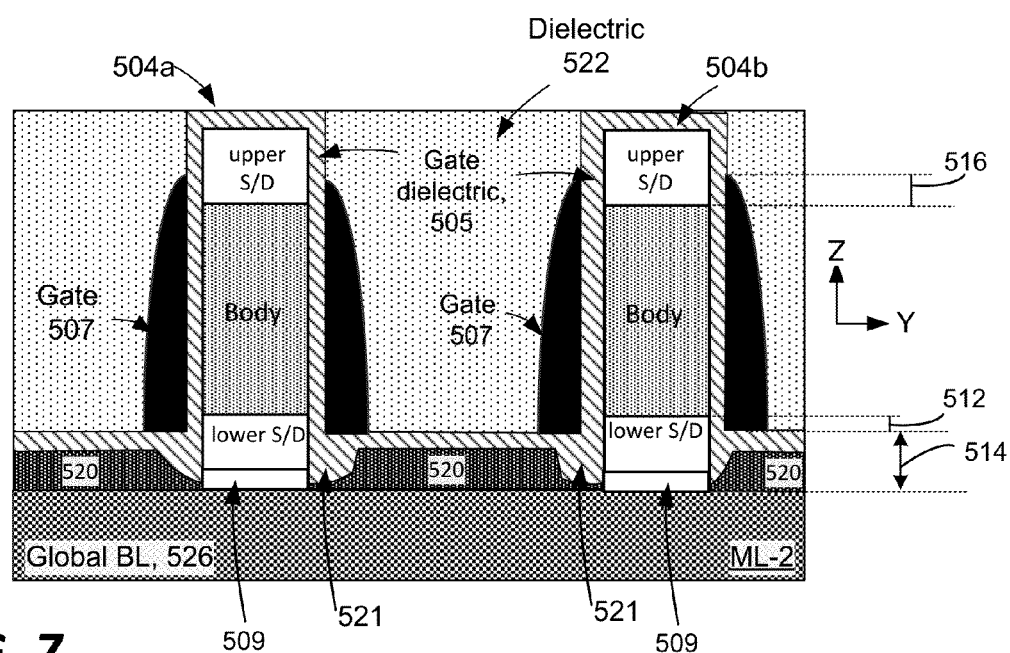
FIG. 7 depicts the structure of two vertical TFT selection devices in accordance with one embodiment.

FIG. 7 depicts an embodiment of a vertical TFT selection device in accordance with an embodiment of the disclosure. FIG. 7 depicts two vertical TFT selection devices 504a and 504b, which may be used for selecting vertically oriented bit lines (not shown). Each vertical TFT selection device 540a, 540b has two source/drain (S/D) regions. The source/drain regions are on either side of the body. The source/drain regions and body are polysilicon in one embodiment. The vertically oriented TFT select devices 504a, 504b has an upper junction between the body and upper S/D and a lower junction between the body and lower S/D.

In this example, each gate 507 extends vertically from below the lower junction to above the upper junction. That is, the gates 507 are formed directly adjacent to the vertical extent of the body and directly adjacent to a portion of the vertical extent of both S/D regions. The lower source/drain is connected to a global bit line in this embodiment. The upper source/drain can be connected to a vertically oriented bit line (not depicted in FIG. 7).

In some embodiments, the body and the S/D regions are of opposite conductivity. For example, the body may be p− and each S/D N+. As another example, the body may be n− and each S/D P+. Thus, the TFT could be an enhancement NFET (N+p−N+) or enhancement PFET (P+n−P+), as two examples. In some embodiments, the body and the S/D regions have the same conductivity. For example, the body may be p− and each S/D P+. As another example, the body may be n− and each S/D N+. Thus, the TFT could be a depletion type N+n−N+ (NFET) or depletion type P+p−P+ (PFET), as two examples. For depletion type devices, N+n−N+ (NFET) and P+p−P+ (PFET), the level of conductivity of each S/D may be much higher than that of the body. In one embodiment, the S/D net doping concentration is 3-4 orders of magnitude greater than the body net doping concentration.

Note that the vertical bit line material may serve as one of the electrodes of read-write memory elements. In some embodiments, the material of the vertical BL is N+ poly. For some types of memory cells, N+ poly serves as a good electrode choice (on the BL side) to achieve desired operation of a specific memory cell and memory array. For other memory cells with different material composition, P+ poly may be chosen as an electrode (on BL side) for desired operation of the memory cell and array. The P+ polysilicon work function is different from N+ polysilicon, and may be more suitable for the electrode material to enable the most efficient memory cell operation. In this latter case, a PFET TFT selection device may be preferable due to its source/drain being P+ (thus matching the vertical bit line). Accordingly, reference to the global bit line 526 or vertical bit line may include reference to such electrodes included with other bit line material such as metals. For example, global bit line 526 may refer to a metal global bit line alone, a semiconductor global bit line along, or a combination of the two materials, such as an N+ or P+ material overlying a metal line.

Each of the vertical TFT selection devices 504a, 504b has two gates 507 and a dielectric material 505 separating each gate from the body and S/D regions. This dielectric may be referred to as a gate dielectric as it separates gates 507 from the body and S/D regions. In one embodiment, the gate dielectric 505 extends along the vertical sidewalls of the source/drain regions and the body or each selection device. The gate dielectric is elongated in the x-direction along the vertical sidewalls of rows of vertical selection devices.

Dielectric bases 520 extend in the y-direction at least partially between adjacent select devices. Bases 520 aid in defining a lower endpoint of gates 507. Bases 520 are provided to establish the lower endpoint at a desired level above the underlying global bit line. The selection device incorporates a vertical TFT channel. Overlap of the edge of the gate 507 and the source/drain regions is a factor that affects performance of the vertical TFT selection device. The gate-drain overlap 512 as illustrated in FIG. 7, is controlled by the drain thickness (vertical), the thickness of electrode 509 and the gate bottom height 514. Controlling the dimensions of these regions and establishing the desired gate bottom height is important in fabricating the selection device. These parameters such as gate-drain overlap affect the TFT threshold voltage (Vth) control and the dielectric strength voltage between the gate and the underlying global bit line. Additionally, the gate-source overlap 516 illustrated in FIG. 7 is affected by the drain thickness, body thickness, electrode thickness, and the gate bottom height.

Bases 520 promote uniformity of the gate bottom height 514 for different select devices 504 to provide uniform operation between devices. Bases 520 can be fabricated to provide tight control of the base thickness and thereby tight control of the gate bottom height 514. Significantly, the gate-drain overlap 512 and gate bottom height 514 to the underlying global bit line can be controlled. Bases 520 includes notches 521 generated as a result of a process used in forming the vertical select device structures with uniformity. Notches 521 are formed at the horizontal endpoints of each base 520. A first notch is formed adjacent to a first select device (e.g., 504a), and a second notch is formed adjacent to a second select device (e.g., 504b). In this example, the notches do not extend fully through each base to the global bit line. Some portion of the base extends completely from the side of the electrode of one select device horizontally to the side of the electrode of an adjacent select device. In other examples, the notches may extend fully through bases 520. The notches create a space horizontally between the sidewall of the select device (e.g., the sidewall of the lower S/D and/or electrode) and the sidewall of the base 520. The notches are filled with gate dielectric 505. In this manner, some portion of the gate dielectric 505 extends below a level of the upper surface of the bases 520.

A gap fill dielectric 522 such as an oxide is formed between adjacent select devices as an insulating material. The gap fill dielectric 522 extends vertically from an upper surface of the gate dielectric 505 between adjacent gates 507 to the upper surface of the gate dielectric that overlies each select device. The gap fill dielectric 522 may be formed after forming the bases 520, gate dielectric 505 and gates 507. The gap fill dielectric may be polished by CMP or etched-back before forming additional layers, for the overlying vertical bit lines for example.

Figure 8:
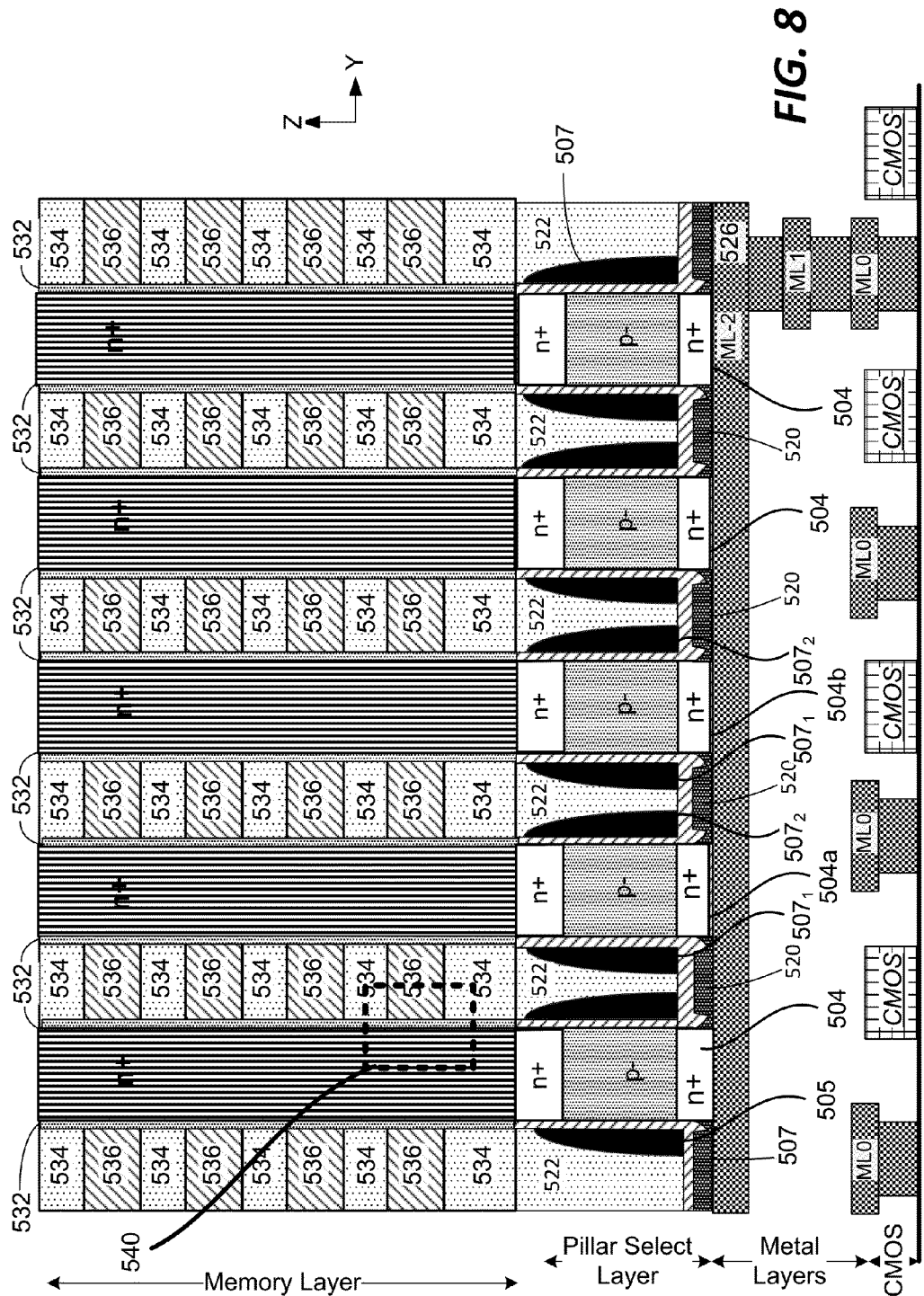
FIG. 8 is a cross-sectional view of a memory structure using one embodiment of a vertically oriented TFT selection device and the memory structure of FIG. 5.

FIG. 8 is a cross-sectional view of a memory structure using a vertically oriented TFT select device 504 as shown in FIG. 7 within the memory structure of FIG. 5. FIG. 8 shows ten gates 507 in a gate material layer, each underneath a stack of multiple word lines. As can be seen, two gates are positioned between pairs of vertically oriented select devices 504, above and not in the substrate. Each select device includes two gates, one on each side formed along a vertical sidewall of the pillar structure. The gates 507 extend horizontally in the x-direction (not shown) and can form row select lines $SG_x$ as shown in FIGS. 1-5. The TFT select device gates 507 are formed over and separated from a base 520 by a gate dielectric 505. The gate of the TFT select devices are separated vertically from the underlying global bit line, at least partially by the gate dielectric and the base 520. Each base 520 includes two notches 521 formed at opposite horizontal ends of the base. The notches may extend fully through the base or may extend partially through as depicted. In either case, the notches create a space between the adjacent select device structure and the base 520.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate.

Directly below each vertical bit line 530 are the vertically oriented TFT select devices 504, each of which comprises (in one example embodiment) an n+/p−/n+ TFT. Each n+ region may be referred to as a source/drain. The p− region may be referred to as a body. The p− region may serve as the channel of the TFT during operation. As noted above, other conductivities can be used in the TFT selection device, with suitable changes to other elements in the memory array.

Each of the vertically oriented TFT select devices 504 includes a gate dielectric 505 on each side. The dielectric 505 is oxide in one embodiment. In this embodiment, each TFT has two gates. Referring to TFT 504a, there is a gate $507_1$ to the left and a gate $507_2$ to the right. The gate dielectric extends horizontally between adjacent select devices over the upper surface of the base 520 in this example. Further, the gate dielectric fills the notches formed at each horizontal end of bases 520. If the notches extend fully through the bases 520, some portion of the gate dielectric 505 may be formed in contact with the underlying global bit line. Although electrodes 509 are not depicted in the example of FIG. 8, electrodes may be includes in other examples as shown in FIG. 7.

In FIG. 8, the channel is not extended on the top of the TFT 504 or on the bottom of the TFT 504. That is, the p− region of each TFT 504 does not extend above the upper surface or portion of gate material 522, nor does the p-region of each TFT 504 extend below the lower surface of portion of gate material 522. However, the vertical TFT selection device 504 may have a channel extension in other embodiments. The channel extension may be formed either at the upper portion or lower portion. The body region extends past the gates in such an embodiment. The channel may be extended on the top or the bottom of the TFT 504. That is, the body region does not extend past the gates at either the lower junction or the upper junction. Thus, the gates are offset from the upper junction or lower junction in this embodiment. By the gate being offset from the junction, it is meant that that the gate is not directly adjacent to the junction. For example, the gates may not be directly adjacent to the upper junction or not directly adjacent to the lower junction. Another way of stating the foregoing is that the top portion of the gates does not extend above the upper junction or the bottom portion of the gates does not extend below the lower junction. In the case the top or/and bottom portion of the gates extend beyond the junction, the structure has respective gate junction overlap, or gate-source or/and gate/drain overlap. More detail regarding structures with a channel offset can be found in U.S. application Ser. No. 13/788,990, referenced above.

The memory structure of FIG. 8 is a continuous mesh array of memory elements because there are memory elements connected to both sides of the bit lines and memory elements connected to both sides of the word lines. At the bottom of FIG. 8, the CMOS substrate is depicted. Implemented on the top surface of the CMOS structure are various metal lines including ML-0, ML-1, and ML-2. Line 526 of ML-2 serves as a respective global bit line (GBL). The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 1), which are labeled in FIG. 8 as row select lines 507. Portions of the row select lines may also be referred to a transistor gates. In one embodiment, an N+ line overlies metal ML-2 serving as part of the global bit line.

Figure 9:
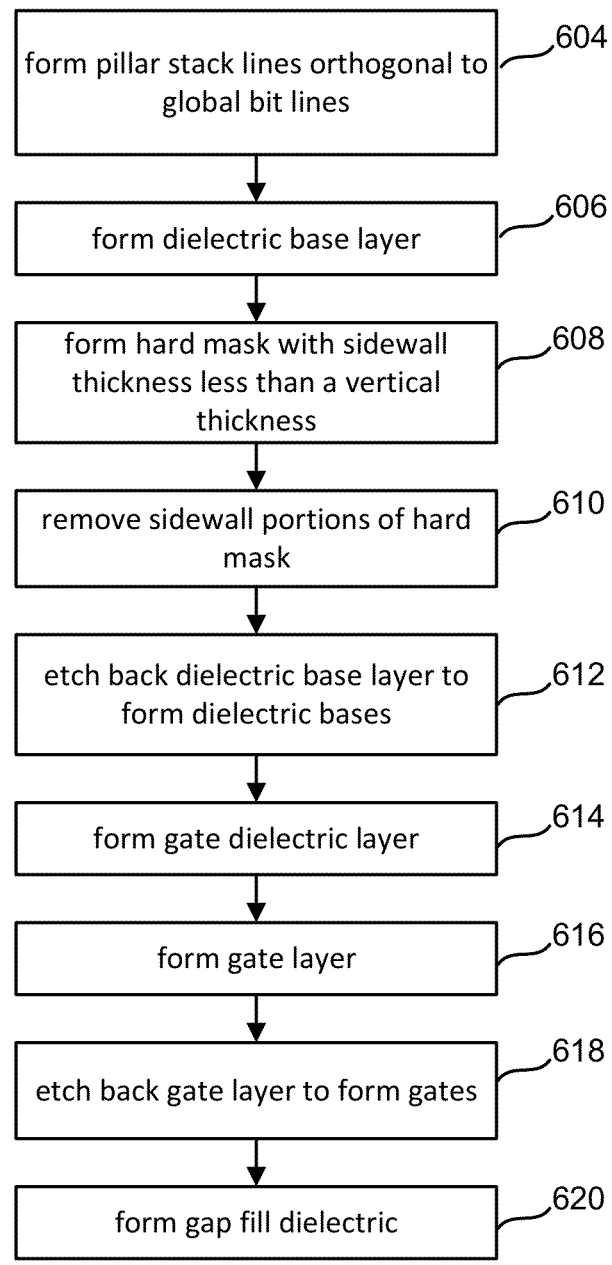
FIG. 9 is a flowchart describing a method of fabricating a pillar select layer including vertical TFT selection devices in one embodiment.

FIG. 9 is a flowchart describing a method of fabricating a pillar select layer having a vertical TFT select device 504 in one embodiment. The process of FIG. 9 may be used to form the pillar select layer depicted in FIGS. 7 and 8. In this embodiment, dielectric bases are formed using a deposition process for the base material, followed by a deposition process to form a hard mask material with a vertical thickness that is larger than a horizontal thickness. Horizontal portions of the hard mask are removed, followed by an etch back of the base material to form uniformly-sized dielectric bases 520. The gate dielectric and gates can then be formed to provide uniformity amongst the select devices 504.

Figure 10A:
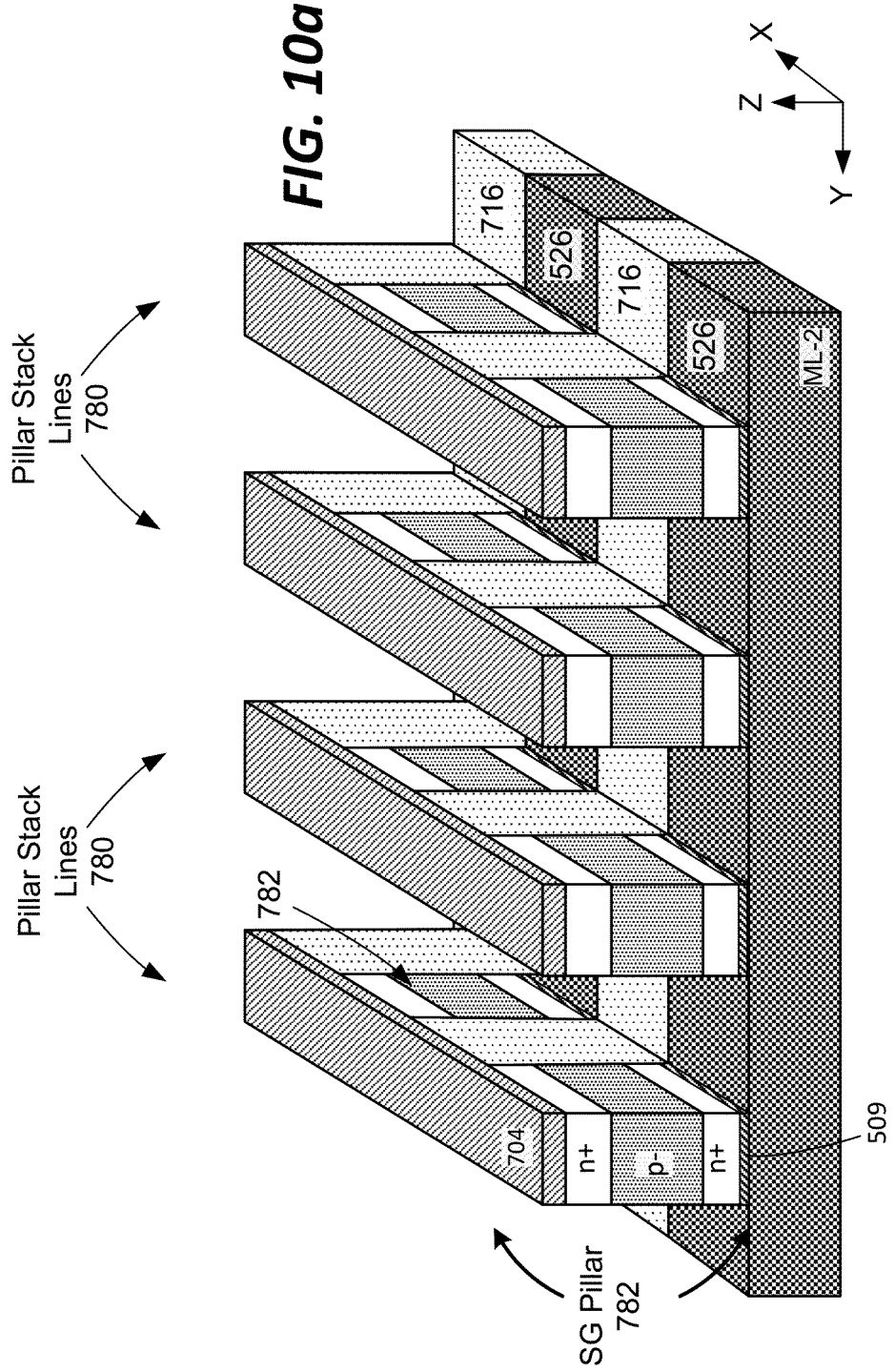

At step 604, pillar stack lines for a pillar select layer are formed over a metal layer. The pillar stack lines are formed in a direction orthogonal to a direction of the global bit lines in one example. FIGS. 10*a* and 10*b* depict the results of step 604 in one embodiment. FIG. 10*a* is a perspective view depicting four pillar stack lines 780, each containing two select gate (SG) or select device pillars 782. FIG. 10*b* is a cross-sectional view in the y-direction depicting a select gate pillar from each of the pillar select lines that are depicted in FIG. 10*a*. It is noted that a typical memory will include many more pillar select lines and within each pillar select line, many more select device pillars. Step 604 and the later steps may be performed before manufacturing the memory layer. The substrate layers and metal layers can be manufactured, followed by forming the select gate layer stack lines for the pillar select structure. The metal layers include a metal layer (e.g., metal layer ML-2) that is patterned and formed into global bit lines extending in the y-direction.

In this example, the metal layer ML-2 has been patterned and etched into global bit lines that are elongated in the y-direction. The global bit lines are separated by dielectric strips 716 formed from an oxide or other insulating material. Over the global bit lines 526 and dielectric 716 are formed pillar stack lines 780 that are elongated in the x-direction. Each pillar stack line includes a plurality of select device pillars 782. Each pillar is separated from adjacent pillars in the same line by insulating material 716. In another example, the insulating material between bit lines and the insulating material between select gate pillars may be different.

Pillar stack lines 780 are formed in one example by forming a layer stack that includes the layers of the select device pillars. The layer stack may also include metal layer ML-2 in one example so that it may be etched using the same pattern for self-alignment. In this manner, the layer stack is first etched to define lines that extend in the y-direction. This etching may further define the global bit lines 526. After forming lines that extend in the y-direction, insulating material 716 may be deposited to fill the spaces between lines adjacent in the x-direction. After forming the insulating material, the layer stack may be patterned and etched to form lines 780 that extend in the x-direction over the global bit lines and insulating material 716. In this manner, select gate pillars 782 are formed in each line 780 that are separated from adjacent pillars of the line by pillars of insulating material 716. It is noted that other techniques may be used for forming select gate pillars 782 and pillar stack lines 780.

Each select gate pillar includes a lower electrode, a lower n+ region forming the lower S/D region for the select device, a p− region forming the body, and an upper n+ region forming the upper S/D region. Note that the upper S/D region is a drain in one example and the lower S/D region is a source. In other example, the upper S/D region is a source and the lower S/D region is a drain. The electrodes may be formed from an N+ layer in one example. In another example, the electrodes may include a metal. The electrode layer is not included in one embodiment. As described above, different configurations and materials may be used to form the body and S/D regions. Each pillar may also include metal (e.g., TiN) and dielectric (e.g., SiN) regions (not shown). The metal region and dielectric region may be used to form a contact to the overlying vertical metal bit line, for example. These regions are optional and are not included in other embodiments. Each pillar stack line includes a strip 712 of hard mask material such SiN overlying the pillar stack line. The strip 712 of hard mask material may be used in etching to form the pillar stack lines, for example.

At step 606, a dielectric base layer is formed. The dielectric base layer is an oxide such as SiO in one embodiment but other materials may be used. FIG. 10*c* depicts the results of step 606 in an embodiment. A deposition process such as atomic layer deposition (ALD) is used to conformally form dielectric base layer 706. In this manner, the dielectric base layer 706 extends vertically along the vertical sidewalls of the pillar stack lines 780 as well as horizontally between adjacent pillar stack lines without filling the spaces between pillar stack lines. Other processes, materials, and dimensions may be used in other examples.

At step 608, a hard mask layer is formed having a sidewall thickness 762 (also referred to as horizontal thickness) that is less than a bottom thickness 760 (also referred to as vertical thickness). FIG. 10*d* depicts the results of step 608 in an embodiment. Plasma vapor deposition (PVD) is used in one example to form a hard mask layer 708 such as SiN or TiN. The process may be controlled to form the material with a larger vertical thickness than horizontal thickness as illustrated in FIG. 10*d*. The hard mask layer includes sidewall portions having a horizontal thickness 762 and that extend along the vertical sidewalls of the pillar stack lines (separated by the base dielectric layer 706). The hard mask layer also includes bottom and top (horizontal) portions having a vertical thickness 760 and that extend horizontally between adjacent pillar stack lines and over each pillar stack line, respectively. In one example, the hard mask layer 708 has a vertical thickness of 10 nm and a horizontal thickness of 5 nm. Other processes materials, and dimensions may be used in other examples.

At step 610, the sidewall portions of the hard mask layer are removed while the top and bottom portions of the hard mask layer remain. FIG. 10*e* depicts the results of step 610 in one embodiment. An etch chemistry that is highly selective to the dielectric base material to avoid etching or over-etching the dielectric base material when etching back the hard mask layer. Because the hard mask layer is formed with a larger vertical thickness, the top and bottom portions of the hard mask layer remain after removing the sidewall portions. This etch back forms hard mask caps 710 over the top and bottom portions of the dielectric base material.

At step 612, the dielectric base layer is etched back. An etch back process highly selective for the dielectric base material can be used in one embodiment. FIG. 10*f* depicts the results of step 612 in one example. Etching back dielectric base layer 706 is performed while hard mask caps 710 protect the horizontal top and bottom portions of the dielectric base layer 706. Etching back the dielectric base layer 706 removes the sidewall portions of the dielectric base layer while the top and bottom portions remain. The bottom portions of the dielectric base layer form bases 520, as also illustrated in FIG. 7. The top portions of the dielectric base layer form top dielectric regions 518.

Etching back the dielectric base layer 706 removes some portion of the sidewall portions that extends below the upper surface of bases 520. Put another way, etching back the dielectric base layer includes etching into the horizontal top and bottom portions. Etching in this manner forms notches 521 in bases 520. These notches provide some spacing between bases 520 and the vertical sidewalls of the pillar stacks at a level below an upper surface of the bases. In FIG. 10*f*, etching proceeds completely through bases 520 until reaching the global bit line layer. Accordingly, notches 521 extend completely through the bases forming spaces between the bases and the vertical sidewalls of the pillar stacks.

FIG. 11*a* depicts an alternate embodiment at the same point in processing as depicted in FIG. 10*f* In this example, etching back the base dielectric layer 706 does not proceed completely through the bases 520. In this example, notches 521 are still formed and a horizontal spacing between the bases and the pillar stack sidewalls is still provided at a level below an upper surface of the bases 520. However, some portion of bases 520 extends below the bases in this example to contact the sidewall of the pillar stacks.

At step 614, a gate dielectric layer is formed. FIG. 10*g* depicts the results of step 614 in one example. The gate dielectric layer 505 layer extends over the upper surface and along the vertical sidewalls (elongated in the x-direction) of each select gate pillar. In one example, gate dielectric layer 505 is an oxide such as silicon oxide or hafnium oxide formed by atomic layer deposition (ALD). In another example, gate dielectric layer 505 is a thermally grown oxide. Conformal deposition can be used to form a dielectric layer between approximately 3 and 10 nanometers in thickness in one example. The gate dielectric layer 505 layer additionally fills notches 521 in the dielectric bases. In this manner, some portion of the gate dielectric layer extends below the upper surface of the dielectric bases 520.

FIG. 11*b* depicts the results of step 614 in an alternate embodiment where notches 521 do not extend completely through bases 520. In this example, the gate dielectric layer still fills notches 521, forming a portion of the gate dielectric layer between the base and the pillar stack at a level below the upper surface of bases 520.

At step 616, the gate layer is formed. FIG. 10*h* depicts the results of step 616 in one example. Gate layer 720 can be formed similarly to gate dielectric material 505 in one example. The gate material can be deposited conformally to cover the gate dielectric 505 in one example. The gate material covers the gate dielectric 505, extending vertically with the gate dielectric along the vertical sidewalls of the select gate pillars and over the upper surface of the gate dielectric at the top of each pillar. In one embodiment, the gate material is TiN. In another embodiment, the gate material is polysilicon. In other example, any of the memory materials described above may be used.

At step 618, the gate layer is etched back to form individual gates that extend vertically along the vertical sidewalls of the pillar stack lines. FIG. 10*i* depicts the results of step 618 in one embodiment. Gate material 720 is etched back to form individual gates 507. Etching back the gate material removes horizontal portions of the gate material to leave sidewall spacers from gate material 720. Each sidewall spacer forms one gate 507. The gates 507 are separated from the pillar stack lines by the gate dielectric 505. In this example, gates 507 may be referred to as spacer gates 507 due to their formation by conformal deposition and etch back as associated with spacer-formation processes. Any suitable etch back process may be used. In the x-direction, the gates extend along pillar stack line to form gates for each select gate formed in the line. In the vertical or z-direction, the upper surface of the gates may extend beyond the upper S/D junction between the p− body region and the upper n+ S/D region. The gates extend vertically toward the substrate, having a lower surface that extends beyond the lower S/D junction between the p− body region and the lower n+ S/D region. As earlier noted, the gate bottom height refers to the vertical distance between the lower surface of the gate and the upper surface of the global bit line. The gate bottom height is controlled by the ALD process for the bases 520 (e.g. SiO) and the gate dielectric deposition. In one embodiment, a thickness variation of about 10% of the ALD base 520 and the gate dielectric thickness may be expected.

Figure 10J:
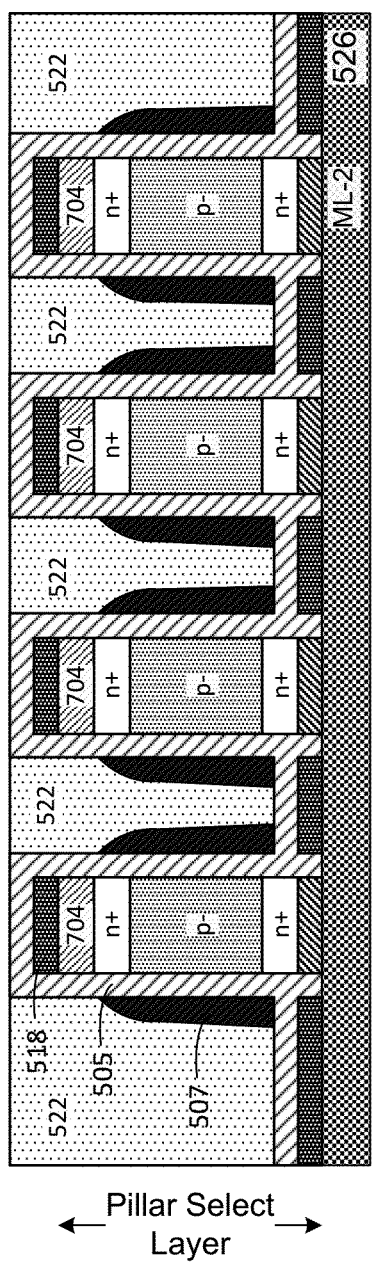

At step 620, a gap fill dielectric is formed. FIG. 10*j* depicts the results of step 620 in one example. Gap fill dielectric 522 fills the spaces between adjacent layer stack lines. The gap fill dielectric 522 is an oxide in one example. ALD, CVD or other processes may be used. In one example, the gap fill dielectric is formed using flowable CVD gap fill technology. Polysilazane-based spin-on-glass techniques may be used. The entirety of the remaining space between layer stack lines is filled with the gap fill dielectric. The gap fill dielectric 520 is formed subsequent to forming gates 507. The dielectric extends vertically to the upper surface of the gate dielectric 505. In this example, the gap fill dielectric extends above each layer stack line, including over the upper surface of the gate dielectric overlying the SiN at the top of each layer stack line. Horizontally, the gap fill dielectric extends in the y-direction between adjacent layer stack lines. The dielectric 520 extends between the vertical sidewalls of the top liner that is formed along the gates and the exposed portions of the gate dielectric. An etch back or polish (e.g., CMP) process may be used to etch back the gate dielectric 505. Processing to form the memory layer, including vertical bit lines coupled to each of the select devices can be performed.

Accordingly, there has been described a three-dimensional (3D) non-volatile memory array having a vertically-oriented thin film transistor (TFT) select device and method of fabricating a 3D memory with a vertically-oriented TFT select device. The vertically-oriented TFT, or more simply vertical TFT, may be used as a vertical bit line select device in one embodiment, coupling a global bit line to a local vertical bit line. A select device pillar includes a body and upper and lower source/drain regions. At least one gate is separated horizontally from the select device pillar by a gate dielectric. Each gate is formed over and separated from the underlying global bit line by a base and a portion of the gate dielectric. The base is formed with notches extending through at least a portion of the base at the horizontal end portions of the base. The notches are filled with the gate dielectric material. A conformal deposition process for the base dielectric material and a hard mask formation process provide tight control for the base thickness. In this manner, the gate bottom height can be formed with tight control for consistent select device performance.

A method of forming non-volatile storage in one embodiment has been described that includes forming over one or more metal layers above a substrate a plurality of pillar stack lines elongated in a first direction. Each pillar stack line includes a plurality of select device pillars. Each select device pillar forms a vertical thin film transistor (TFT) select device. The method includes forming a dielectric base layer having sidewall portions that extend vertically along each of the pillar stack lines and horizontal portions that extend horizontally between each of the pillar stack lines, forming a hard mask layer over the dielectric base layer that has a sidewall thickness that is less than a vertical thickness, etching back the hard mask layer to form a plurality of caps over the horizontal portions of the dielectric base layer, etching back the dielectric base layer to remove at least a portion of the sidewall portions and form a plurality of dielectric bases between adjacent pillar stack lines, forming a gate dielectric layer after forming the plurality of dielectric bases, and forming and etching back a gate layer to form at least one gate separated from each pillar stack line by the gate dielectric.

A method of forming non-volatile storage in one embodiment has been described that includes forming over one or more metal layers above a substrate a plurality of pillar stack lines elongated in a first direction. Each pillar stack line includes a plurality of select device pillars separated by an insulating material. Each select device pillar forms a vertical thin film transistor (TFT) select device above a substrate. The method includes forming and etching back a dielectric base layer to form a plurality of dielectric bases including a dielectric base between each pillar stack line. Etching forms in each dielectric base a first notch at a first end of the dielectric base and a second notch at a second end of the dielectric base. The method includes forming a gate dielectric layer after forming the base dielectric. The gate dielectric layer fills the first notch and the second notch in each trench and extends vertically along a first sidewall and a second sidewall of each pillar stack line. The method includes forming and etching a gate layer to form a first gate separated from the first vertical sidewall of each pillar stack line by the gate dielectric and a second gate separated from the second vertical sidewall of each pillar stack line by the gate dielectric.

A non-volatile storage system in one embodiment has been described that includes a global bit line, a first vertical thin film transistor (TFT) select device formed over the global bit line and a second vertical thin film transistor (TFT) select device formed over the global bit line. The first vertical TFT select device has a first vertical sidewall and a first gate and the second vertical TFT select device has a second vertical sidewall and a second gate. The system includes a dielectric base extending partially between the first vertical sidewall and the second vertical sidewall. The dielectric base has a first notch formed at a first end adjacent to the first vertical sidewall and a second notch formed at a second end adjacent to the second vertical sidewall. The system includes a gate dielectric formed along the first vertical sidewall and separates the first gate from the first vertical sidewall. The gate dielectric is formed along the second vertical sidewall and separates the second gate from the second vertical sidewall. The gate dielectric extends vertically in the first notch and the second notch such that the gate dielectric extends below an upper surface of the dielectric base.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of forming non-volatile storage, comprising:
   forming over one or more metal layers above a substrate a plurality of pillar stack lines elongated in a first direction, each pillar stack line including a plurality of select device pillars, each select device pillar forming a vertical thin film transistor (TFT) select device;
   forming a dielectric base layer having sidewall portions that extend vertically along each of the pillar stack lines and horizontal portions that extend horizontally between each of the pillar stack lines;
   forming a hard mask layer over the dielectric base layer, the hard mask layer includes sidewall portions that extend vertically along the sidewall portions of the dielectric base layer and horizontal portions that extend horizontally over the horizontal portions of the dielectric base layer, the hard mask layer having a sidewall thickness that is less than a vertical thickness;
   etching back the hard mask layer to form a plurality of caps over the horizontal portions of the dielectric base layer;
   etching back the dielectric base layer to remove at least a portion of the sidewall portions and form a plurality of dielectric bases between adjacent pillar stack lines;
   forming a gate dielectric layer after forming the plurality of dielectric bases; and forming and etching back a gate layer to form at least one gate separated from each pillar stack line by the gate dielectric layer.

2. The method of claim 1, wherein forming the hard mask layer having a sidewall thickness that is less than a vertical thickness includes forming the hard mask layer by plasma vapor deposition.

3. The method of claim 2, wherein forming the dielectric base layer includes forming the dielectric base layer by atomic layer deposition.

4. The method of claim 1, wherein etching back the hard mask layer includes removing the sidewall portions to form the plurality of caps.

5. The method of claim 1, wherein etching back the dielectric base layer forms in each dielectric base a first notch at a first end of the dielectric base and a second notch at a second end of the dielectric base.

6. The method of claim 5, wherein forming the gate dielectric layer after forming the plurality of dielectric bases includes filling the first notch at the first end of each dielectric base and the second notch at the second end of each dielectric base, the gate dielectric layer extending below a level of an upper surface of the dielectric bases.

7. The method of claim 1, wherein:
the one or more metal layers include a plurality of global bit lines formed in a first metal layer over the substrate; and
each select device pillar includes a lower source/drain (S/D) region and an upper S/D region separated by a body, the lower S/D region is coupled to a global bit line and the upper S/D region is coupled to a vertical bit line.

8. The method of claim 7, wherein:
each select device pillar includes an electrode coupled between the lower S/D region and the global bit line.

9. The method of claim 1, wherein forming and etching back the gate material includes forming a first gate separated from a first vertical sidewall of each pillar stack line by the gate dielectric and a second gate separated from a second vertical sidewall of each pillar stack line by the gate dielectric.

10. A method of forming non-volatile storage, comprising:
forming over one or more metal layers above a substrate a plurality of pillar stack lines elongated in a first direction, each pillar stack line including a plurality of select device pillars separated by an insulating material, each select device pillar forms a vertical thin film transistor (TFT) select device above a substrate;
forming and etching back a dielectric base layer to form a plurality of dielectric bases including a dielectric base between each pillar stack line, wherein etching forms in each dielectric base a first notch at a first end of the dielectric base and a second notch at a second end of the dielectric base;
forming a gate dielectric layer after forming the dielectric base, the gate dielectric layer filling the first notch and the second notch in each trench and extending vertically along a first sidewall and a second sidewall of each pillar stack line; and
forming and etching a gate layer to form a first gate separated from the first vertical sidewall of each pillar stack line by the gate dielectric layer and a second gate separated from the second vertical sidewall of each pillar stack line by the gate dielectric layer.

11. The method of claim 10, wherein:
forming the dielectric base layer forms sidewall portions along a first vertical sidewall and a second vertical sidewall of each pillar stack line;
forming the dielectric base layer forms horizontal portions between adjacent pillar stack lines; and
the method further comprises, after forming the dielectric base layer and before etching the dielectric base layer, forming a hard mask layer including sidewall portions along the sidewall portions of the dielectric base layer and horizontal portions along the horizontal portions of the dielectric base layer, the sidewall portions of the hard mask layer having a sidewall thickness that is less than a vertical thickness of the horizontal portions of the hard mask layer.

12. The method of claim 11, further comprising:
etching back the hard mask layer prior to etching the bottom dielectric layer, wherein etching back the hard mask layer removes the sidewall portions of the hard mask layer to expose the sidewall portions of the dielectric base layer while leaving the horizontal portions of the hard mask layer covering the horizontal portions of the dielectric base layer.

13. The method of claim 12, wherein:
etching back the dielectric base layer removes at least a portion of the sidewall portions of the dielectric base layer to form the plurality of dielectric bases.

14. The method of claim 13, wherein forming the hard mask layer comprises plasma vapor deposition to generate the sidewall thickness at less than the vertical thickness.

15. The method of claim 10, wherein each pillar stack forms a vertical thin film transistor (TFT) select device.

16. The method of claim 10, wherein:
the one or more metal layers include a plurality of global bit lines formed in a first metal layer over the substrate; and
the vertical TFT select device of each select device pillar includes a first S/D region coupled to a global bit line, a second S/D region coupled to a vertical bit line, and a body separating the first S/D region from the second S/D region.

* * * * *